(12) United States Patent
Saito et al.

(10) Patent No.: US 12,557,348 B2
(45) Date of Patent: Feb. 17, 2026

(54) SEMICONDUCTOR DEVICE

(71) Applicant: Mitsubishi Electric Corporation, Tokyo (JP)

(72) Inventors: Hisashi Saito, Tokyo (JP); Yuki Takiguchi, Tokyo (JP); Shigeyoshi Usami, Tokyo (JP); Takahiro Yamada, Tokyo (JP); Marika Nakamura, Tokyo (JP); Eiji Yagyu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 729 days.

(21) Appl. No.: 17/913,846

(22) PCT Filed: May 13, 2020

(86) PCT No.: PCT/JP2020/019050
§ 371 (c)(1),
(2) Date: Sep. 23, 2022

(87) PCT Pub. No.: WO2021/229702
PCT Pub. Date: Nov. 18, 2021

(65) Prior Publication Data
US 2023/0352599 A1 Nov. 2, 2023

(51) Int. Cl.
*H10D 30/83* (2025.01)
*H10D 30/01* (2025.01)
(Continued)

(52) U.S. Cl.
CPC .......... *H10D 30/83* (2025.01); *H10D 30/051* (2025.01); *H10D 30/475* (2025.01);
(Continued)

(58) Field of Classification Search
CPC .... H10D 30/83; H10D 30/051; H10D 30/475; H10D 62/343; H10D 62/824; H10D 62/8503; H10D 62/117; H10D 62/149
See application file for complete search history.

(56) References Cited

U.S. PATENT DOCUMENTS

| | | |
|---|---|---|
| 6,020,607 A | 2/2000 | Nagai |
| 2011/0140174 A1 | 6/2011 | Kaneko |

(Continued)

FOREIGN PATENT DOCUMENTS

| | | |
|---|---|---|
| JP | 61-185976 A | 8/1986 |
| JP | 8-227900 A | 9/1996 |

(Continued)

OTHER PUBLICATIONS

Murata, Tomohiro et al.; Source Resistance Reduction of AlGaN-GaN HFETs with Novel Superlattice Cap Layer (Listed on the PTO-892 Form as "17913846_Non_Patent_Literature_2024-10-29).pdf") (Year: 2005).*

(Continued)

*Primary Examiner* — Fernando L Toledo
*Assistant Examiner* — Shawn Shaw Muslim
(74) *Attorney, Agent, or Firm* — XSENSUS LLP

(57) ABSTRACT

A source layer is provided on a first p-type layer made of a nitride-based semiconductor, and includes a semiconductor region including electrons as carriers. A drain layer faces the source layer in a first direction on the first p-type layer with a gap being provided therebetween, and includes a semiconductor region including electrons as carriers. A channel structure is provided between the source layer and the drain layer on the first p-type layer, in which a channel region and a gate region are alternately disposed in a second direction perpendicular to the first direction. A channel layer included in the channel structure forms at least a part of the channel (Continued)

region, and is made of a nitride-based semiconductor. A gate layer included in the channel structure forms at least a part of the gate region, and electrically connects a gate electrode and the first p-type layer.

19 Claims, 32 Drawing Sheets

(51) Int. Cl.
*H10D 30/47* (2025.01)
*H10D 62/17* (2025.01)
*H10D 62/824* (2025.01)
*H10D 62/85* (2025.01)

(52) U.S. Cl.
CPC ......... *H10D 62/343* (2025.01); *H10D 62/824* (2025.01); *H10D 62/8503* (2025.01)

(56) References Cited

U.S. PATENT DOCUMENTS

| 2018/0219086 | A1 | 8/2018 | Higuchi et al. |
| 2020/0303534 | A1* | 9/2020 | Ram ................ H10D 30/675 |

FOREIGN PATENT DOCUMENTS

| JP | 2011-124385 A | 6/2011 |
| JP | 2016-54215 A | 4/2016 |
| JP | 2017-22323 A | 1/2017 |
| JP | 2017-73526 A | 4/2017 |
| JP | 2019-117919 A | 7/2019 |

OTHER PUBLICATIONS

Machine Translation of JP_2017073526_.pdf (Year: 2017).*
Jessen et al.; Short-Channel Effect Limitations on High Frequency Operation of AlGaN/GaN HEMTs for T-Gate Devices (Year: 2007).*
Murata, Tomohiro [et.al]: Source resistance reduction of AlGaN-GaN HFETs with novel superlattice cap layer. In: IEEE transactions on electron devices, vol. 52, 2005, No. 6, S. 1042-1047.—ISSN 0018-9383.
German Office Action issued Aug. 26, 2024, in corresponding German Patent Application 11 2020 007 178.2, 16pp.
International Search Report and Written Opinion mailed on Jul. 14, 2020, received for PCT Application PCT/JP2020/019050, filed on May 13, 2020, 8 pages including English Translation.
Jessen et al., "Short-Channel Effect Limitations on High-Frequency Operation of AlGaN/GaN HEMTs for T-Gate Devices", IEEE Transactions on Electron Devices, vol. 54, Sep. 2007, pp. 2589-2597.
Shinohara et al., "GaN-Based FETs with Laterally-Gated Multi-2DEG Channels for High Power and Linearity", Conference paper, Mar. 25, 2019, pp. 356-358.

* cited by examiner

F I G. 1
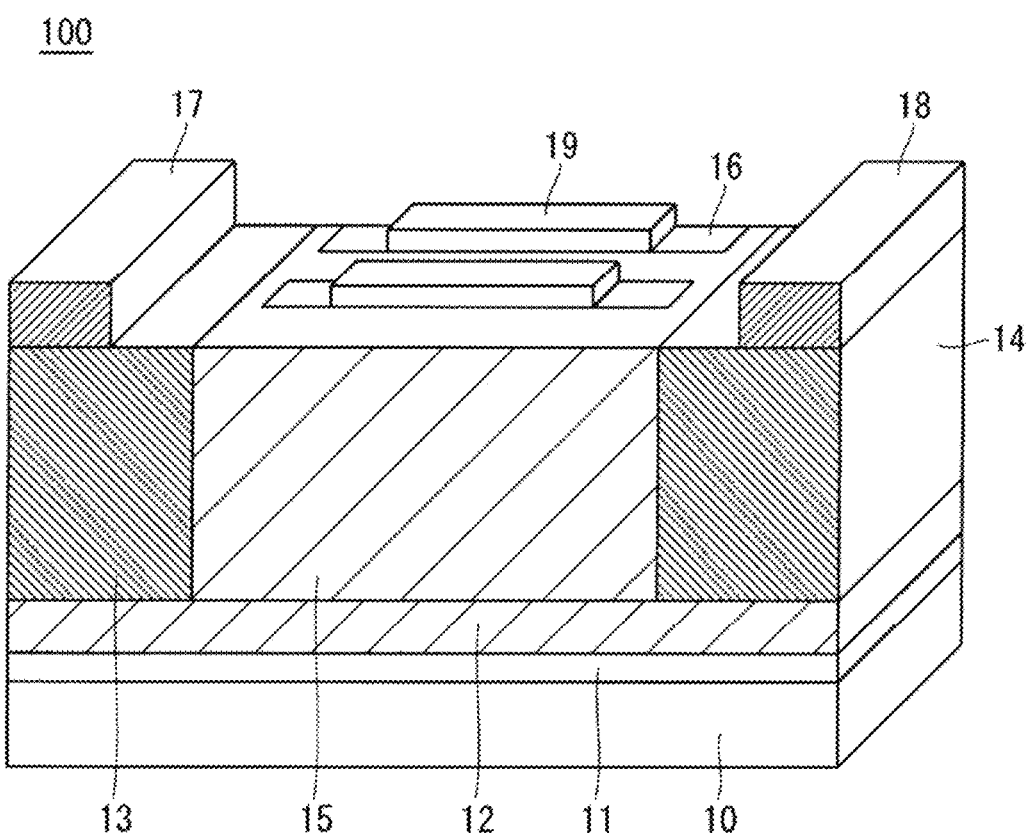

F I G. 2
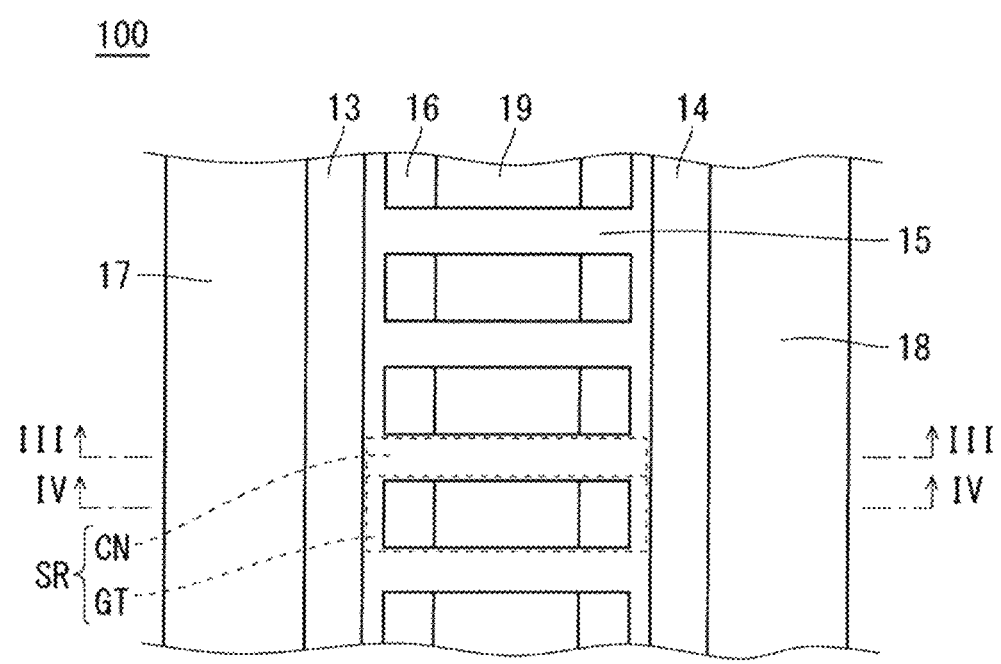

F I G. 3
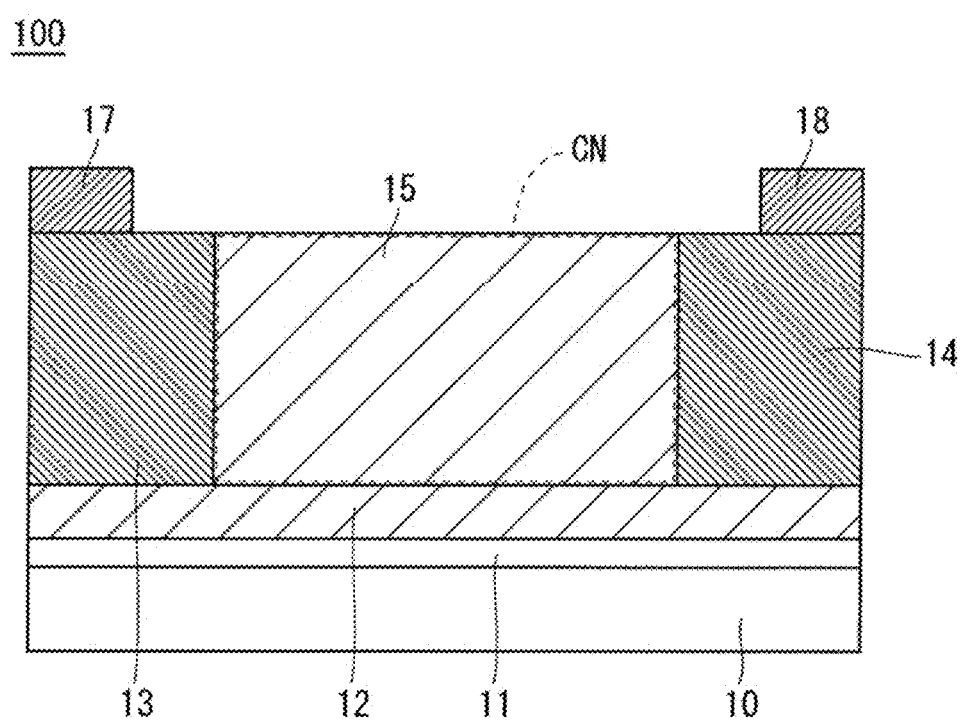

F I G. 4
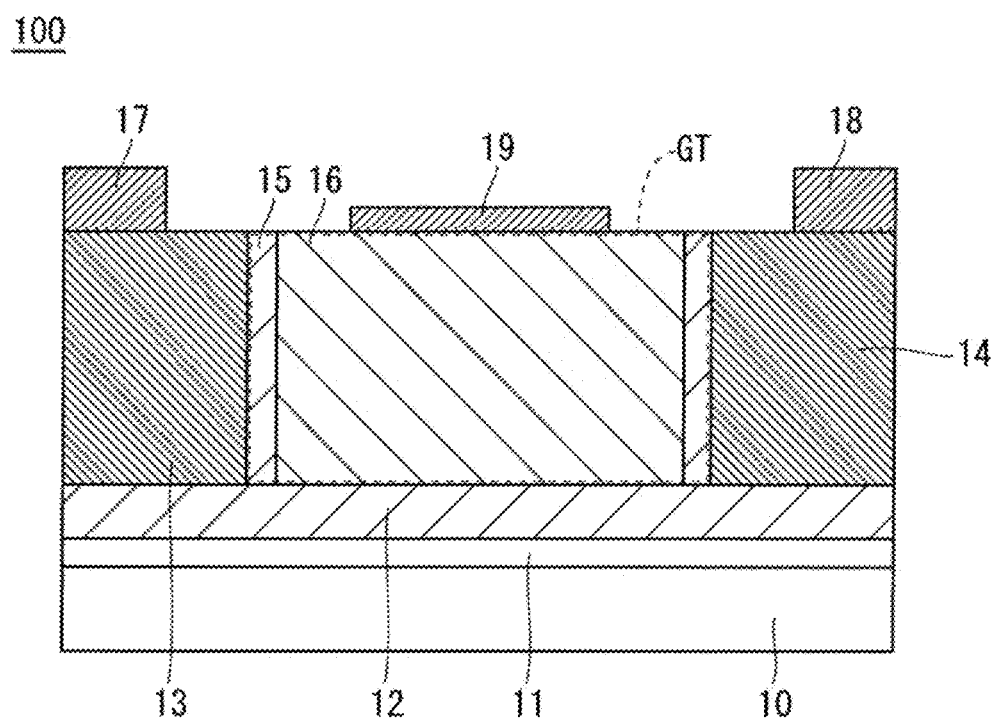

F I G. 6
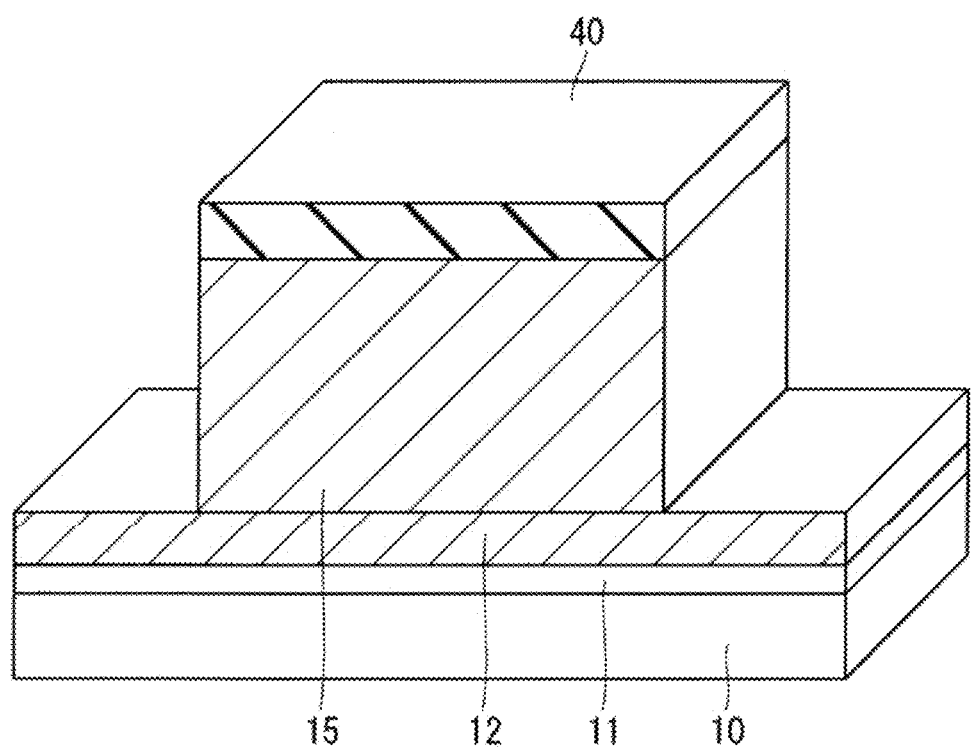

F I G. 8
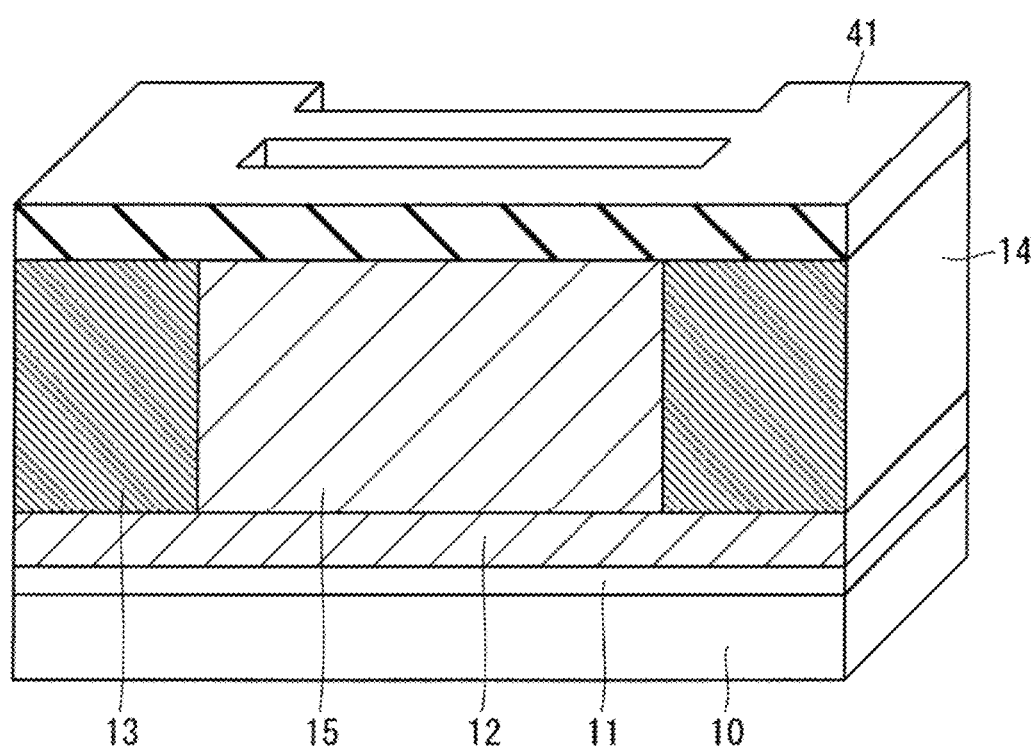

F I G. 1 6
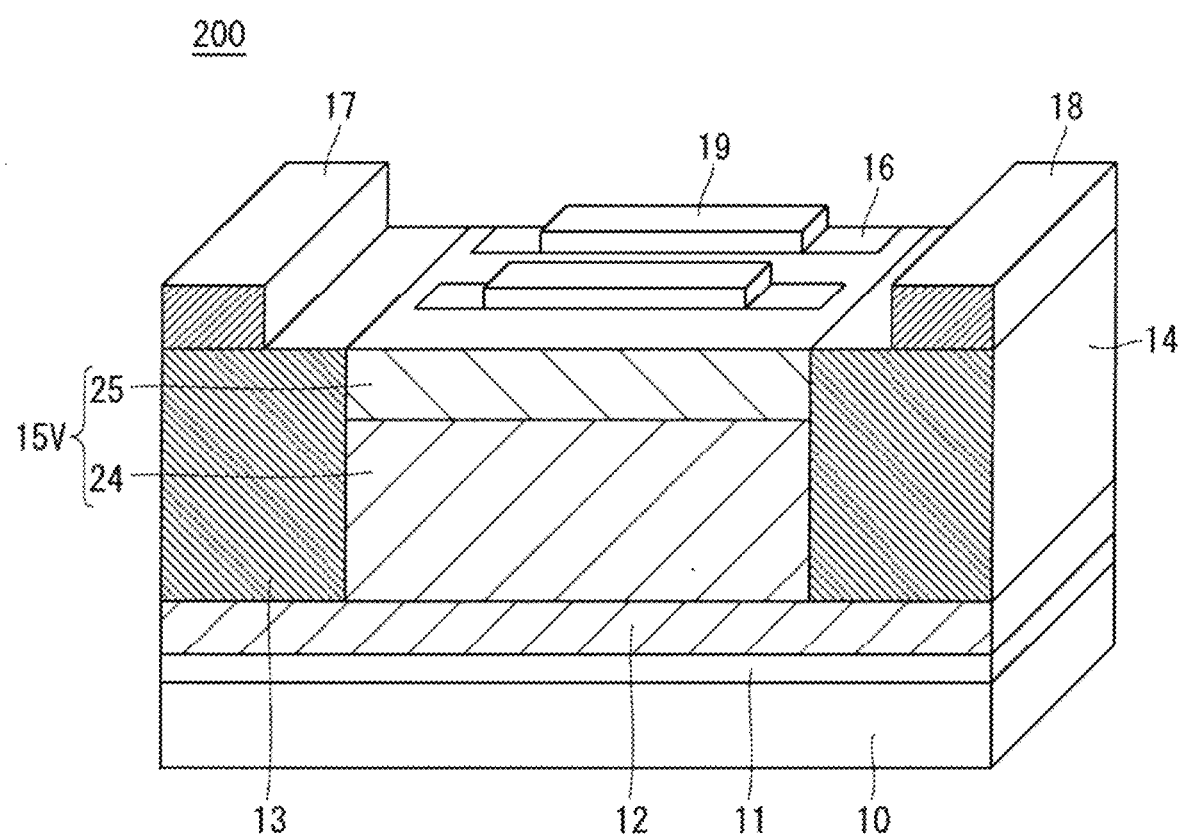

F I G. 19
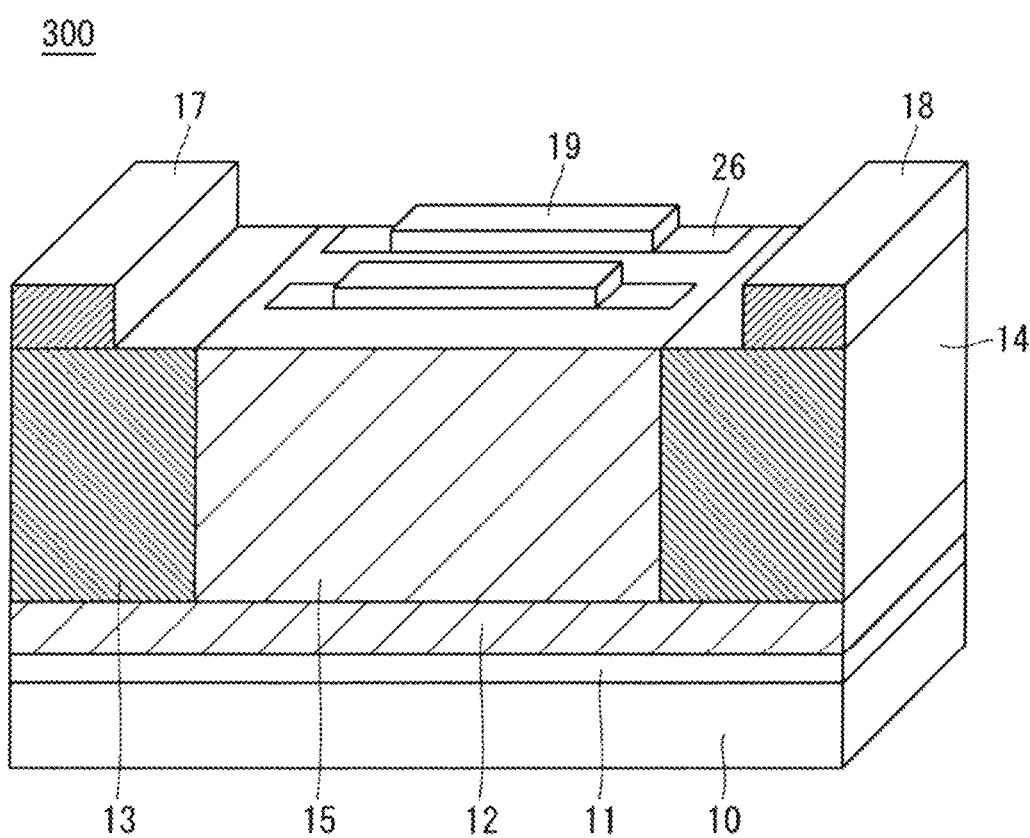

F I G. 2 5
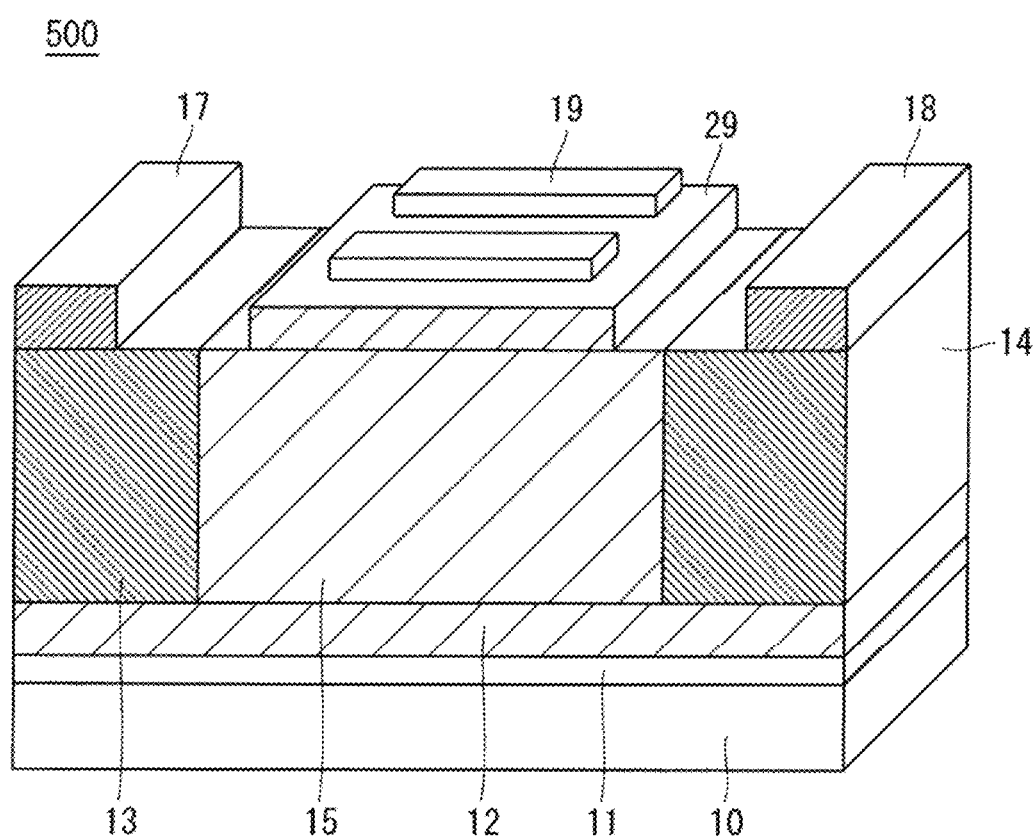

F I G. 2 8
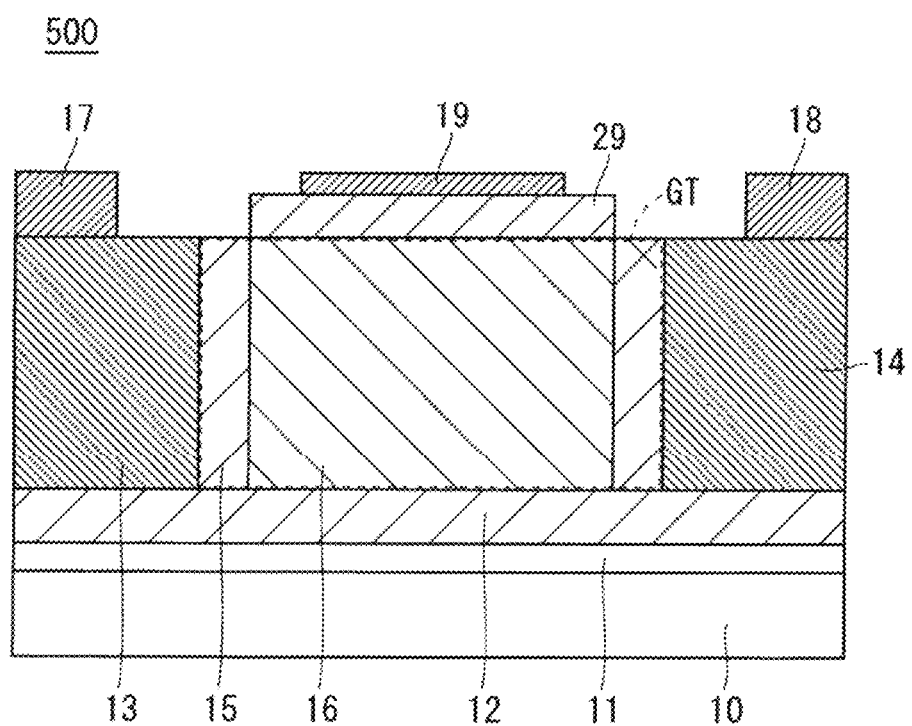

F I G. 3 1
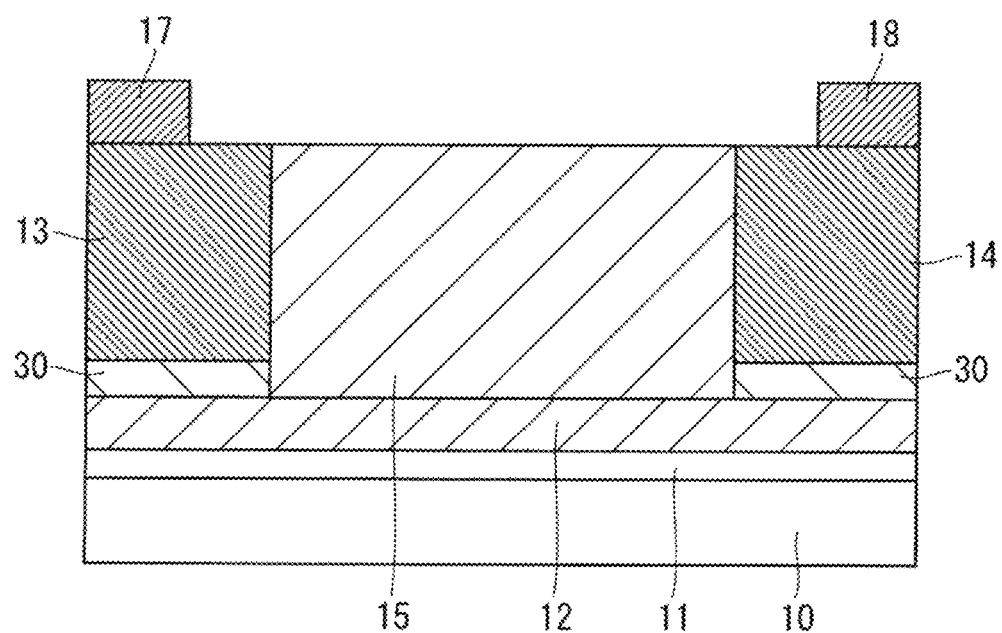

SEMICONDUCTOR DEVICE

CROSS-REFERENCE TO RELATED APPLICATION

The present application is based on PCT filing PCT/JP2020/019050, filed May 13, 2020, the entire contents of which are incorporated herein by reference.

TECHNICAL FIELD

The present disclosure relates to a semiconductor device, and in particular, relates to a semiconductor device which can operate at microwave frequencies.

BACKGROUND ART

It is known that a conventional transistor using a nitride-based semiconductor can implement a semiconductor device which can operate at high frequencies such as a microwave band with high output power by using, for example, a high electron mobility transistor (HEMT) structure or the like (for example, see Non-Patent Document 1 below).

PRIOR ART DOCUMENTS

Non-Patent Documents

Non-Patent Document 1: G. H. Jessen et al, "Short-Channel Effect Limitations on High-Frequency Operation of AlGaN/GaN HEMTs for T-Gate Devices," IEEE Trans. Electron Devices, vol. 54, pp. 2589-2597 September 2007

SUMMARY

Problem to be Solved by the Invention

In order to have the above-described semiconductor device operate in higher frequencies and with higher output power, it is important to reduce gate length. However, as described in the document above, when the gate length is reduced, there is a problem that a phenomenon called short-channel effects is caused and leakage current flows between a drain and a source.

The present disclosure is made in order to solve the problem as described above, and has an object to provide a semiconductor device that can suppress short-channel effects even when gate length is reduced.

Means to Solve the Problem

A semiconductor device according to the present disclosure can operate at microwave frequencies, and has a first direction and a second direction perpendicular to each other in in-plane directions perpendicular to a thickness direction. The semiconductor device includes a first p-type layer, a source layer, a source electrode, a drain layer, a drain electrode, a gate electrode, and a channel structure. The first p-type layer is made of a nitride-based semiconductor. The source layer is provided on the first p-type layer, and includes a semiconductor region including electrons as carriers. The source electrode is provided on the source layer. The drain layer is provided to face the source layer in the first direction on the first p-type layer with a gap being provided between the drain layer and the source layer, and includes a semiconductor region including electrons as carriers. The drain electrode is provided on the drain layer. The gate electrode is separated from the source electrode and the drain electrode, and is provided between the source electrode and the drain electrode in the first direction. The channel structure is provided between the source layer and the drain layer on the first p-type layer, in which a channel region and a gate region are alternately disposed in the second direction. The channel structure includes a channel layer and a gate layer. The channel layer forms at least a part of the channel region, and is made of a nitride-based semiconductor. The gate layer forms at least a part of the gate region, and electrically connects the gate electrode and the first p-type layer.

Effects of the Invention

According to the present disclosure, because the channel region and the gate region are alternately disposed in the second direction, an electric field according to a gate potential can be applied to the channel layer in the channel region from both of one side and another side in the second direction. In addition, because the channel layer is disposed on the first p-type layer electrically connected to the gate electrode, an electric field according to a gate potential can also be applied to the channel layer in the channel region from the thickness direction. From the above, an electric field according to a gate potential can be applied to the channel layer in the channel region from three directions. This enhances gate controllability, and thus lines of electric force from a drain to a source can be reduced. Therefore, short-channel effects can be suppressed.

These and other objects, features, aspects and advantages of the present disclosure will become more apparent from the following detailed description of the present disclosure when taken in conjunction with the accompanying drawings.

BRIEF DESCRIPTION OF DRAWINGS

FIG. 1 is a cross-sectional perspective view schematically illustrating a configuration of a semiconductor device according to the first embodiment.

FIG. 2 is a top view of FIG. 1.

FIG. 3 is a cross-sectional view taken along the line III-III of FIG. 2.

FIG. 4 is a cross-sectional view taken along the line IV-IV of FIG. 2.

FIG. 6 is a cross-sectional perspective view schematically illustrating a second process of the manufacturing method of the semiconductor device according to the first embodiment.

FIG. 8 is a cross-sectional perspective view schematically illustrating a fourth process of the manufacturing method of the semiconductor device according to the first embodiment.

FIG. 16 is a cross-sectional perspective view schematically illustrating a configuration of a semiconductor device according to the second embodiment.

FIG. 19 is a cross-sectional perspective view schematically illustrating a configuration of a semiconductor device according to the third embodiment.

FIG. 25 is a cross-sectional perspective view schematically illustrating a configuration of a semiconductor device according to the fifth embodiment.

FIG. 28 is a cross-sectional view taken along the line XXVIII-XXVIII of FIG. 26.

FIG. 31 is a cross-sectional view taken along the line XXXI-XXXI of FIG. 30.

DESCRIPTION OF EMBODIMENTS

Figure 5:
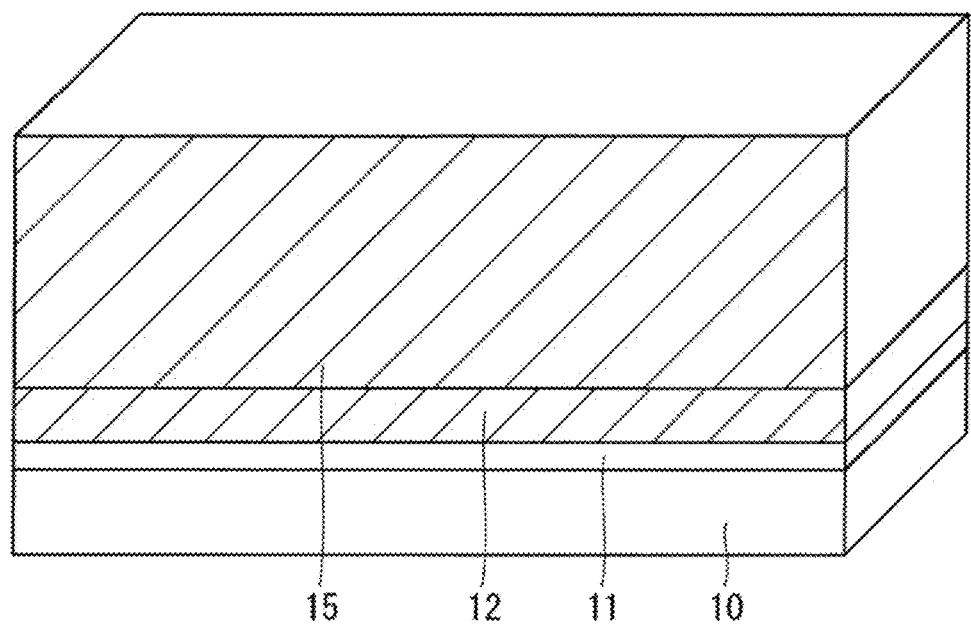
FIG. 5 is a cross-sectional perspective view schematically illustrating a first process of a manufacturing method of the semiconductor device according to the first embodiment.

Embodiments will be described below based on the drawings. In these drawings, the same or corresponding parts are denoted by the same reference numerals, and description thereof is not repeated. Further, a semiconductor device of the present disclosure may be disposed in any orientation in a gravity direction. Thus, terms in this specification that imply relative positional relationships between constituent elements, such as "upper", "lower", "above", "below", "upper surface", and "lower surface", do not necessarily use a gravity direction as a reference, and any direction may be used as a reference instead of the weight direction. Further, in the specification, a "nitride-based semiconductor" is a general term for a semiconductor containing gallium nitride (GaN), aluminum nitride (AlN), indium nitride (InN), and intermediate composition of those.

First Embodiment

FIG. 1 and FIG. 2 are a cross-sectional perspective view and a top view schematically illustrating a configuration of a transistor 100 (semiconductor device) according to the first embodiment, respectively. FIG. 3 and FIG. 4 are cross-sectional views taken along the line III-III and the line IV-IV of FIG. 2, respectively.

The transistor 100 is a semiconductor device which can operate at microwave frequencies. The transistor 100 has a first direction (lateral direction in FIG. 2) and a second direction (longitudinal direction in FIG. 2) that are perpendicular to each other in in-plane directions perpendicular to a thickness direction (longitudinal direction in each of FIG. 1, FIG. 3, and FIG. 4). In the perspective view of FIG. 1, the first direction is a width direction, and the second direction is a depth direction. The transistor 100 includes a p-type layer 12 (first p-type layer), a source layer 13, a source electrode 17, a drain layer 14, a drain electrode 18, a gate electrode 19, and a channel structure SR. The transistor 100 may further include a substrate 10, and may further include a nucleation layer 11 (buffer layer).

The p-type layer 12 is made of a nitride-based semiconductor. The p-type layer 12 is preferably made of $Al_xGa_{1-x}N$ ($1 \geq x \geq 0$), and for example, is made of GaN. The thickness (dimension in the longitudinal direction in FIG. 3 and FIG. 4) of the p-type layer 12 is 2 µm or less, for example.

The source layer 13 is provided on the p-type layer 12, and includes a semiconductor region including electrons as carriers. The drain layer 14 is provided on the p-type layer 12, and includes a semiconductor region including electrons as carriers. Specifically, the source layer 13 and the drain layer 14 each include a semiconductor region being doped to have an n type, and owing to the doping, the electrons as the carriers are generated. The source layer 13 and the drain layer 14 are made of GaN, for example. The thickness of each of the source layer 13 and the drain layer 14 is 20 nm or more and 2 µm or less, for example. On the p-type layer 12, the drain layer 14 faces the source layer 13 in the first direction (lateral direction in FIG. 2) with a gap being provided therebetween.

The source electrode 17 and the drain electrode 18 are provided on the source layer 13 and the drain layer 14, respectively. Each of the source electrode 17 and the drain electrode 18 is preferably made of metal, and contains at least one of titanium and aluminum, for example. It is preferable that an ohmic contact be formed between the source electrode 17 and the source layer 13, and between the drain electrode 18 and the drain layer 14.

The gate electrode 19 is separated from the source electrode 17 and the drain electrode 18, and is provided between the source electrode 17 and the drain electrode 18 in the first direction (lateral direction in FIG. 2).

The channel structure SR is provided between the source layer 13 and the drain layer 14 on the p-type layer 12. In the channel structure SR, a channel region CN and a gate region GT are disposed alternately in the second direction (longitudinal direction in FIG. 1). The channel structure SR includes a channel layer 15 and a gate layer 16.

The channel layer 15 is made of a nitride-based semiconductor. The channel layer 15 forms at least a part of the channel region CN, and in the present embodiment, forms the entire channel region CN. Thus, in the present embodiment, one end surface and another end surface of the channel layer 15 come in contact with the source layer 13 and the drain layer 14 in the channel region CN, respectively. The channel layer 15 may also form a part of the gate region GT. The channel layer 15 is formed of an n-type or undoped single layer. When the channel layer 15 has the n type, it is preferable that impurity concentration thereof be equal to or lower than impurity concentration of the gate layer 16. A dopant for providing the n type is Si, for example. The thickness of the channel layer 15 is 20 nm or more and 2 µm or less, for example.

The gate layer 16 forms at least a part of the gate region GT. In the present embodiment, the gate layer 16 forms a part of the gate region GT, and is specifically disposed apart from each of the source layer 13 and the drain layer 14 in the gate region GT. Further, another part of the gate region GT is formed of the channel layer 15, and the channel layer 15 separates the gate layer 16 (FIG. 4) from the source layer 13 and the drain layer 14. Note that, as a modification, one end surface of the gate layer 16 may come in contact with the source layer 13 in the gate region GT, and alternatively or simultaneously, another end surface of the gate layer 16 may come in contact with the drain layer 14. The gate layer 16 electrically connects the gate electrode 19 and the p-type layer 12. In order that such electrical connection be obtained, the gate electrode 19 is formed on the gate layer 16 in the gate region GT, and the gate layer 16 is formed above the p-type layer 12. The gate layer 16 has the p type, and is made of a nitride-based semiconductor, for example, made of GaN. The thickness of the gate layer 16 is 20 nm or more and 2 µm or less, for example. The gate electrode 19 is made of metal, or a p-type or n-type semiconductor. As the metal, for example, Ni or Pt can be applied. As the p-type semiconductor, for example, boron-doped polysilicon can be applied. As the n-type semiconductor, for example, phosphor-doped polysilicon can be applied.

The substrate 10 supports the p-type layer 12. The p-type layer 12 is disposed between each of the source layer 13 and the drain layer 14 and the substrate 10. The p-type layer 12 includes a lower surface facing the substrate 10, and an upper surface facing the source layer 13 and the drain layer 14. A material of the substrate 10 is, for example, silicon carbide, silicon, gallium nitride, or sapphire.

The nucleation layer 11 is provided between the p-type layer 12 and the substrate 10. Specifically, the nucleation layer 11 is epitaxially grown on the substrate 10, and the p-type layer 12 is epitaxially grown on the nucleation layer 11. The nucleation layer 11 has composition different from composition of the substrate 10 and the p-type layer 12, and is made of aluminum nitride, for example.

When the transistor 100 is operated, the source electrode 17 is grounded and a voltage is applied to the gate electrode 19, such that a potential of the gate layer 16 is controlled. With this, a channel is switched on and off. For the transistor 100 to operate satisfactorily at microwave frequencies, a dimension of the gate layer 16 in the gate region GT in the first direction (lateral direction in FIG. 2) is 0.5 µm or less, for example.

With further reference to FIG. 5 to FIG. 11, next, an example of a manufacturing method of the transistor 100 will be described below.

FIG. 5 is a cross-sectional perspective view schematically illustrating a first process. The nucleation layer 11, the p-type layer 12, and the channel layer 15 are epitaxially grown on the substrate 10 in this order, using metal organic chemical vapor deposition (MOCVD), for example.

FIG. 6 is a cross-sectional perspective view schematically illustrating a second process. A mask layer 40 is formed on the channel layer 15. For example, $SiO_2$ is deposited using chemical vapor deposition (CVD). Next, the mask layer 40 is patterned using optical lithography or the like. Next, the channel layer 15 is etched using the mask layer 40. Etching is performed with inductive coupling plasma reactive ion etching (ICP-RIE) using a chlorine gas or the like, for example.

Figure 7:
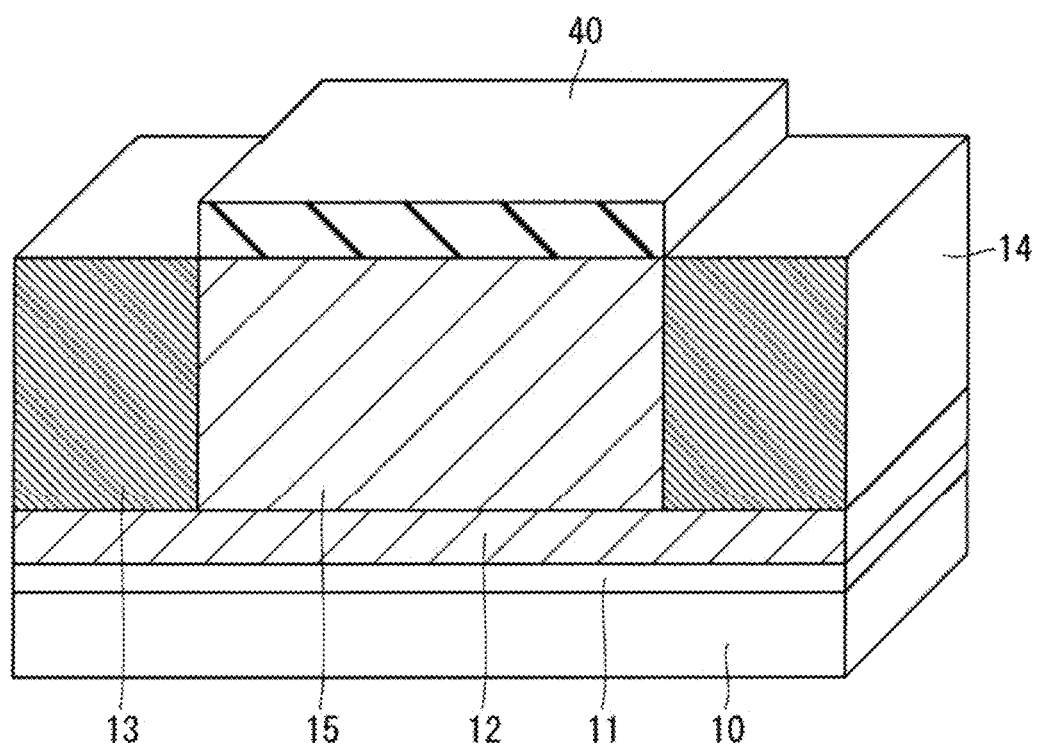
FIG. 7 is a cross-sectional perspective view schematically illustrating a third process of the manufacturing method of the semiconductor device according to the first embodiment.

FIG. 7 is a cross-sectional perspective view schematically illustrating a third process. For example, the source layer 13 and the drain layer 14 are epitaxially grown using the MOCVD method.

Figure 9:
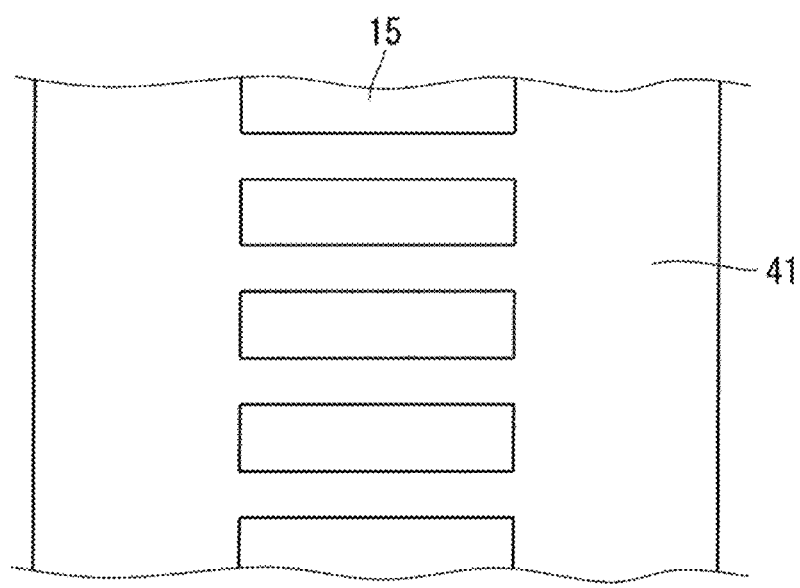
FIG. 9 is a top view of FIG. 8.

FIG. 8 and FIG. 9 are a cross-sectional perspective view and a top view schematically illustrating the third process, respectively. A mask layer 41 is formed on an upper surface formed by the source layer 13, the drain layer 14, and the channel layer 15. For example, $SiO_2$ is deposited using the CVD method. Next, the mask layer 41 is patterned using optical lithography or the like. Next, the channel layer 15 is etched using the mask layer 41.

Figure 10:
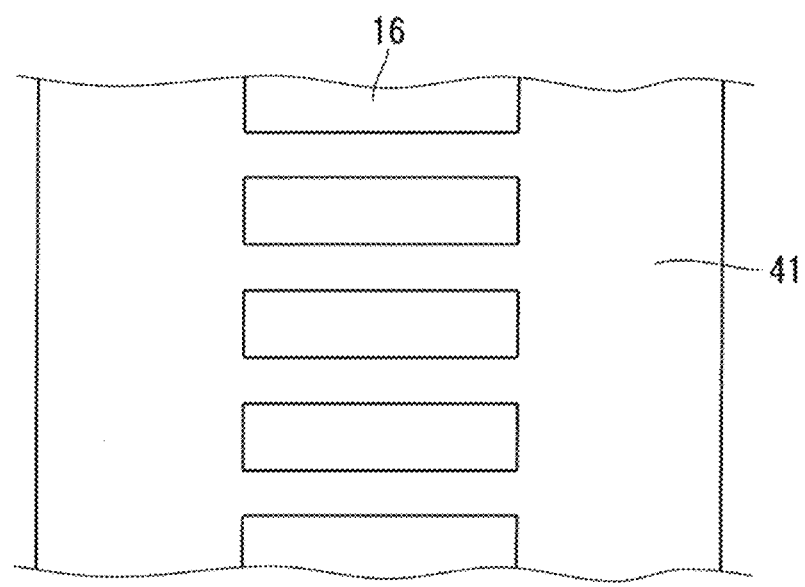
FIG. 10 is a top view schematically illustrating a fifth process of the manufacturing method of the semiconductor device according to the first embodiment.
Figure 11:
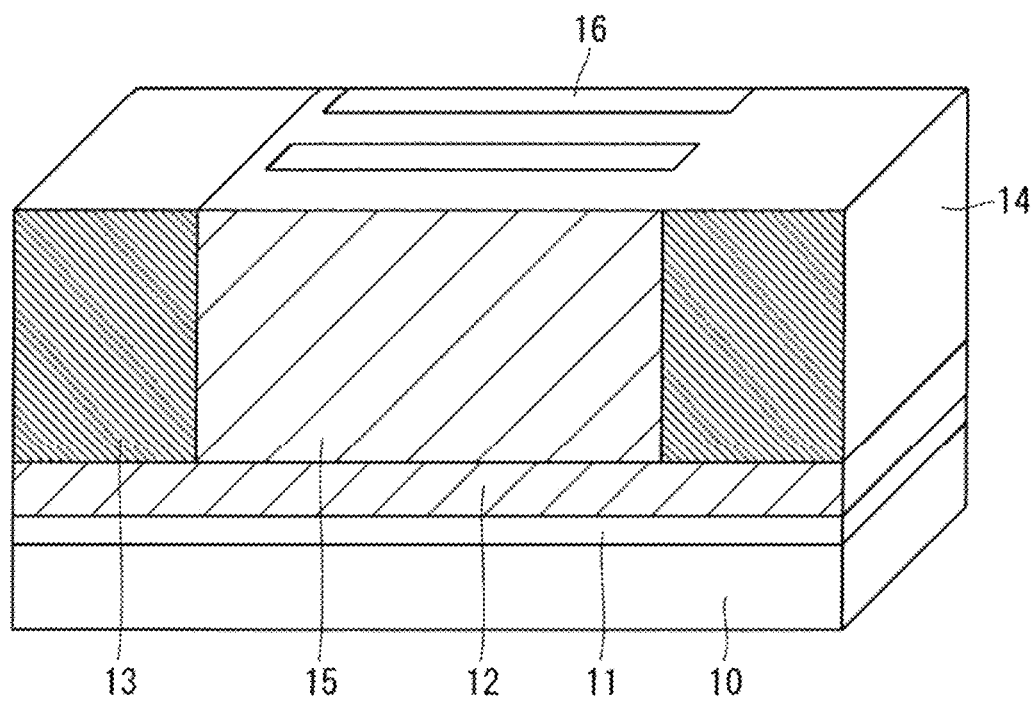
FIG. 11 is a cross-sectional perspective view of FIG. 10.

FIG. 10 and FIG. 11 are a top view and a cross-sectional perspective view schematically illustrating a fourth process, respectively. For example, the gate layer 16 is epitaxially grown using the MOCVD method.

With reference to FIG. 1 again, the source electrode 17, the drain electrode 18, and the gate electrode are formed using the MOCVD method, for example. With this, the transistor 100 is obtained.

Note that, as a modification, the source layer 13 and the drain layer 14 having the n type may be formed through ion implantation into a semiconductor layer such as the channel layer 15 (see FIG. 5) or the like. Si is implanted as a dopant, for example. After the ion implantation, thermal treatment for activating the dopant is performed.

According to the present embodiment, because the channel region CN and the gate region GT are alternately disposed in the second direction (longitudinal direction in FIG. 2), an electric field according to a gate potential can be applied to the channel layer 15 in the channel region CN from both of one side and another side in the second direction. In addition, because the channel layer 15 (FIG. 3) is disposed on the p-type layer 12 (FIG. 3 and FIG. 4) electrically connected to the gate electrode 19 (FIG. 4) via the gate layer 16 (FIG. 4), an electric field according to a gate potential can be applied to the channel layer 15 in the channel region CN (FIG. 2) from the thickness direction as well. From the above, an electric field according to a gate potential is applied to the channel layer 15 in the channel region CN from three directions. In other words, channel control of switching on and off a channel by applying a gate potential is performed through application of an electric field from three directions. This enhances gate controllability (controllability of a channel through application of a gate potential), and thus lines of electric force from a drain to a source can be reduced. Therefore, short-channel effects can be reduced.

Further, because the channel region CN and the gate region GT are alternately arrayed as described above in the second direction (longitudinal direction in FIG. 2), the width (dimension in the longitudinal direction in FIG. 2) of each of the channel regions CN, i.e., each channel width, is smaller than the width of the source layer 13 (dimension in the longitudinal direction in FIG. 2). This can suppress depletion of carriers contributing to conduction.

With the channel layer 15 (FIG. 3) being formed of a single layer, the manufacturing method of the transistor 100 can be simplified as compared to a case where the channel layer 15 is formed of multiple layers. Further, the entire single layer can be used as a channel in the channel region CN.

It is preferable that the channel layer 15 have impurity concentration (doping concentration) equal to or lower than impurity concentration (doping concentration) of the gate layer 16. In other words, it is preferable that the impurity concentration of the gate layer 16 be equal to or higher than the impurity concentration of the channel layer 15. With this, gate controllability can be further enhanced.

When the nucleation layer 11 is provided between the p-type layer 12 and the substrate 10, lattice mismatch between the substrate 10 and the p-type layer 12 can be reduced.

<Modification of First Embodiment>

Figure 12:
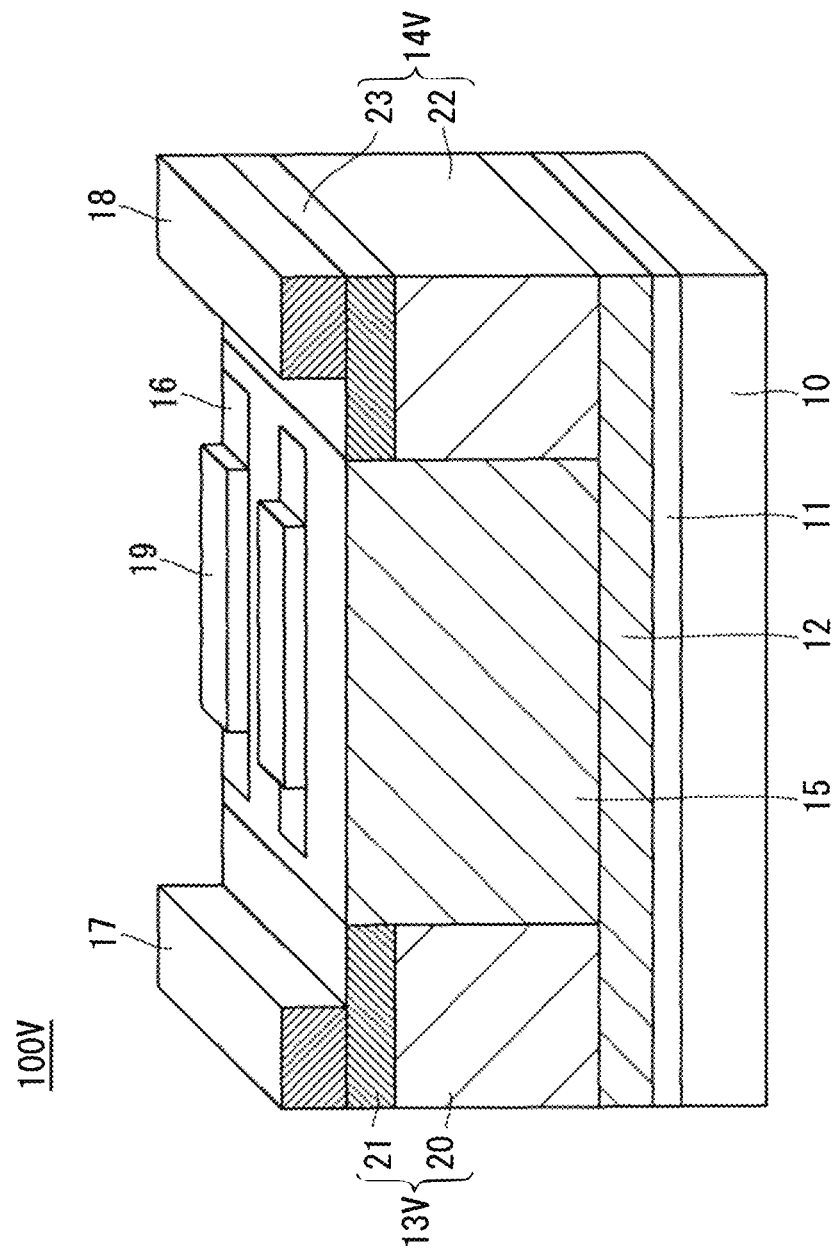
FIG. 12 is a cross-sectional perspective view schematically illustrating a configuration of a semiconductor device according to a modification of the first embodiment.
Figure 13:
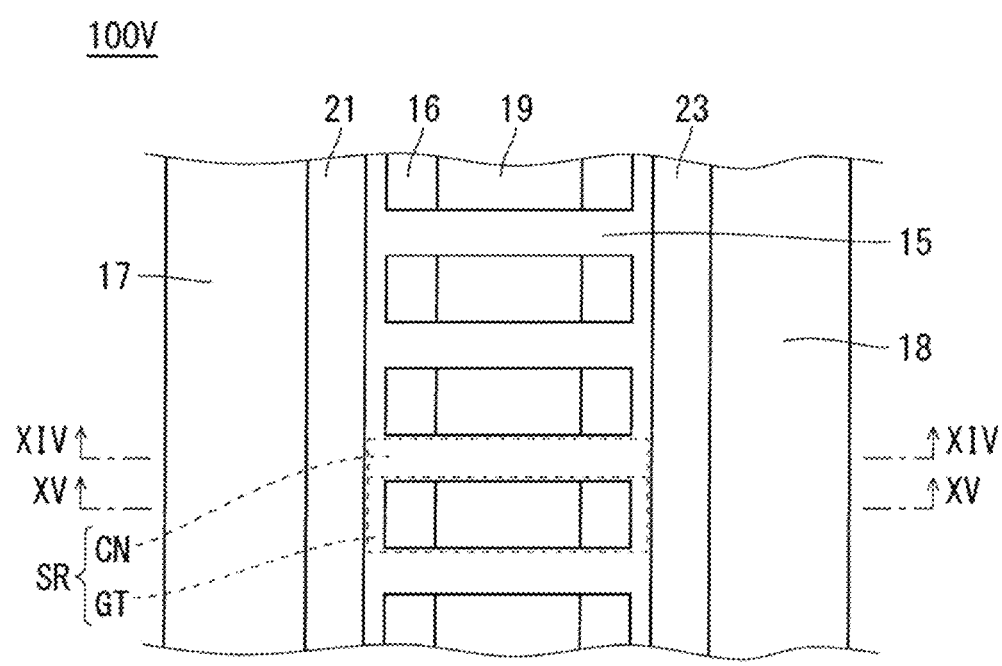
FIG. 13 is a top view of FIG. 12.
Figure 14:
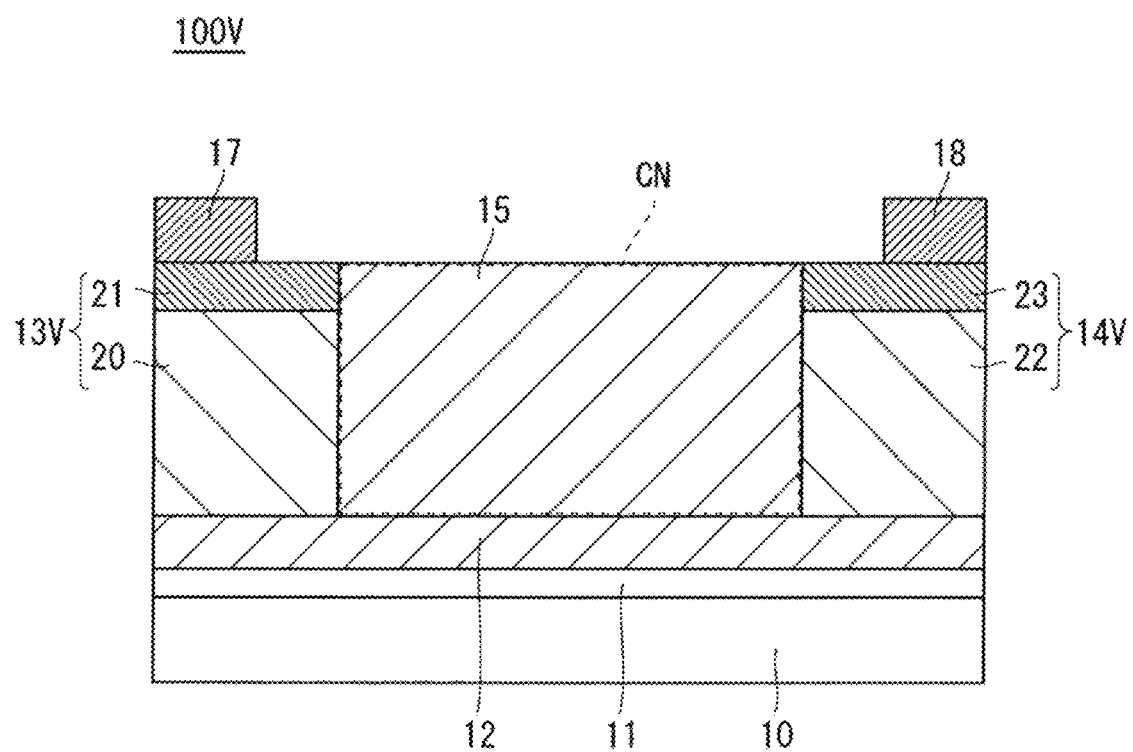
FIG. 14 is a cross-sectional view taken along the line XIV-XIV of FIG. 13.
Figure 15:
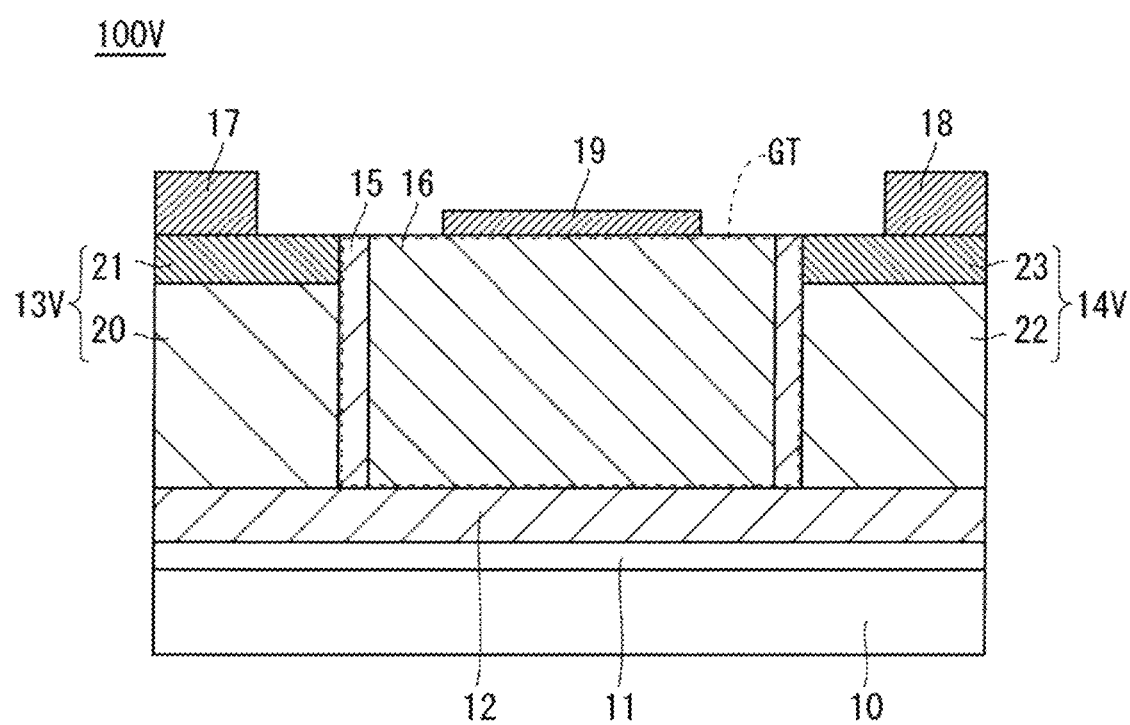
FIG. 15 is a cross-sectional view taken along the line XV-XV of FIG. 13.

FIG. 12 and FIG. 13 are a cross-sectional perspective view and a top view schematically illustrating a configuration of a transistor 100V (semiconductor device) according to a modification of the first embodiment, respectively. FIG. 14 and FIG. 15 are cross-sectional views taken along the line XIV-XIV and the line XV-XV of FIG. 13, respectively.

The transistor 100V includes a source layer 13V and a drain layer 14V instead of the source layer 13 and the drain layer 14, respectively, included in the transistor 100 (FIG. 1 to FIG. 4). The source layer 13V and the drain layer 14V are made of a nitride-based semiconductor. The source layer 13V includes a first source film 20, and a second source film 21 that is provided on the first source film 20 and has a larger band gap than the first source film 20. The drain layer 14V includes a first drain film 22, and a second drain film 23 that is provided on the first drain film 22 and has a larger band gap than the first drain film 22. For example, the first source film 20 and the first drain film 22 are of GaN, and the second source film 21 and the second drain film 23 are of AlGaN. The first source film 20 and the first drain film 22 may be undoped. The second source film 21 and the second drain film 23 may be undoped, or may be doped to have the n type.

According to the present modification, a two dimensional electron gas (2DEG) owing to polarization is formed between the first source film 20 and the second source film 21 in the source layer 13V. Similarly, a 2DEG is formed in the drain layer 14V. Due to these 2DEGs, semiconductor regions including electrons as carriers are provided in the source layer 13V and the drain layer 14V. As a result, mobility between the gate electrode 19 and each of the source electrode 17 and the drain electrode 18 can be enhanced.

Further, by concentrating electrical conduction in a confined range of the 2DEG, parasitic capacitance is reduced. With this, operating characteristics of the transistor 100V at microwave frequencies can be enhanced.

Second Embodiment

Figure 17:
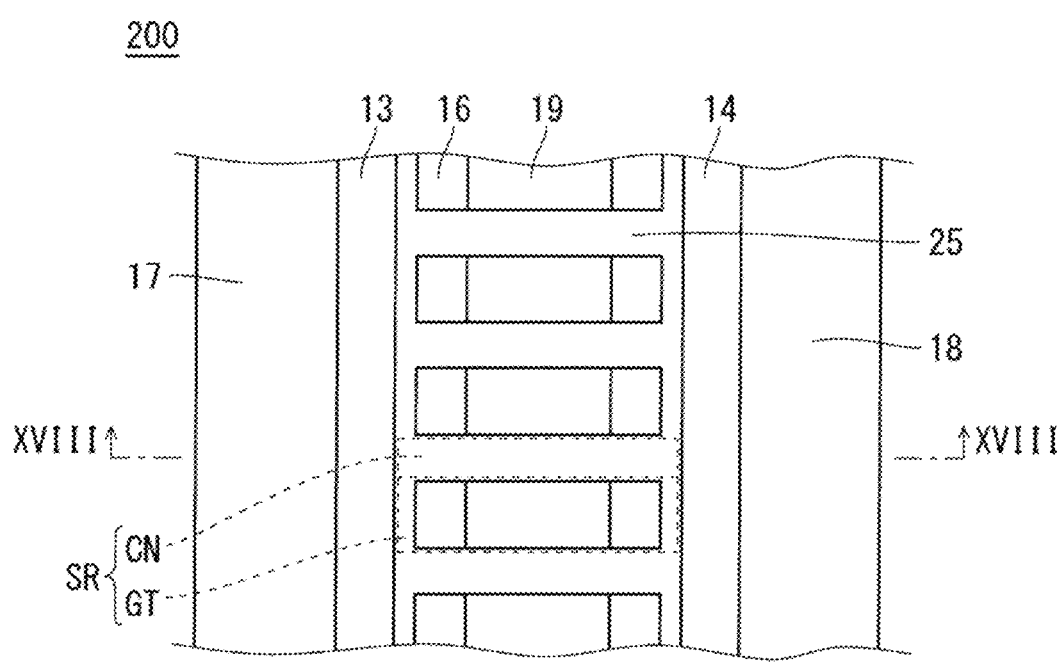
FIG. 17 is a top view of FIG. 16.
Figure 18:
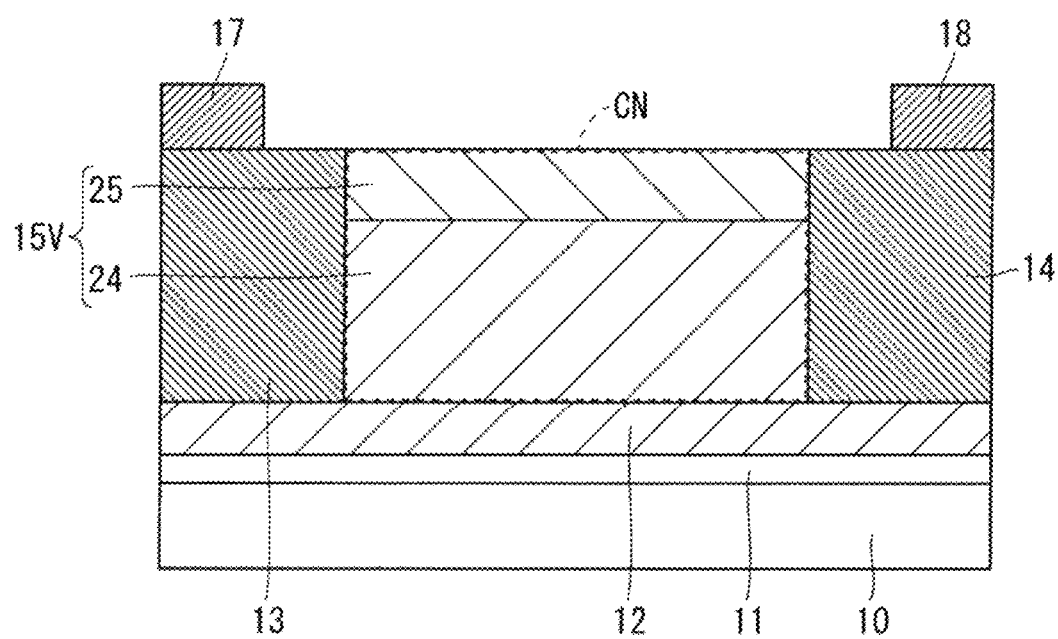
FIG. 18 is a cross-sectional view taken along the line XVIII-XVIII of FIG. 17.

FIG. 16 and FIG. 17 are a cross-sectional perspective view and a top view schematically illustrating a configuration of a transistor 200 (semiconductor device) according to the second embodiment, respectively. FIG. 18 is a cross-sectional view taken along the line XVIII-XVIII of FIG. 17.

The transistor 200 includes a channel layer 15V instead of the channel layer 15 included in the transistor 100 (FIG. 1 to FIG. 4). The channel layer 15V is made of a nitride-based semiconductor. The channel layer 15V is a heterojunction layer formed of a first channel film 24 and a second channel film 25 that is provided on the first channel film 24 and has a larger band gap than the first channel film 24. For example, the first channel film 24 is of GaN, and the second channel film 25 is of AlGaN.

The second channel film 25 may have the n type. A dopant for providing the n type is Si, for example.

Note that a configuration other than the above is substantially the same as the configuration of the first embodiment described above, and thus the same or corresponding elements are denoted by the same reference signs, and description thereof is not repeated.

According to the present embodiment, a 2DEG owing to polarization is formed between the first channel film 24 and the second channel film 25 in the channel layer 15V. As a result, channel mobility can be enhanced as compared to the channel layer 15 (first embodiment). With this, operating characteristics of the transistor 200 at microwave frequencies can be enhanced.

When the second channel film 25 has the n type, concentration of the 2DEG can be increased. With this, it is expected that current driving capability of the transistor 200 is enhanced.

Third Embodiment

Figure 20:
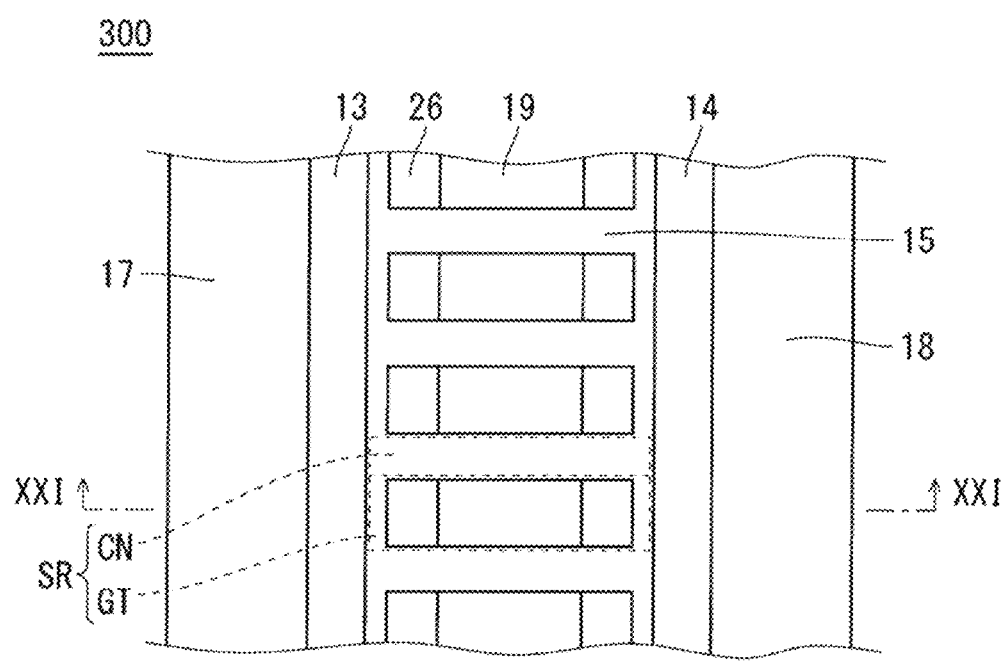
FIG. 20 is a top view of FIG. 19.
Figure 21:
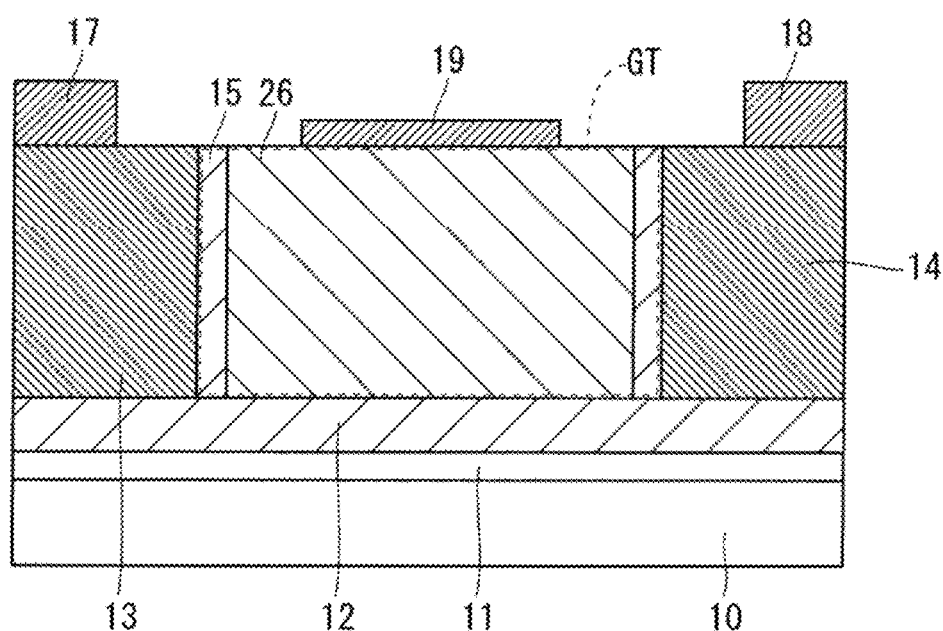
FIG. 21 is a cross-sectional view taken along the line XXI-XXI of FIG. 20.

FIG. 19 and FIG. 20 are a cross-sectional perspective view and a top view schematically illustrating a configuration of a transistor 300 (semiconductor device) according to the third embodiment, respectively. FIG. 21 is a cross-sectional view taken along the line XXI-XXI of FIG. 20.

The transistor 200 includes a gate layer 26 instead of the gate layer 16 included in the transistor 100 (FIG. 1 to FIG. 4). The gate layer 26 has the p type. The gate layer 26 includes a polycrystalline structure. The gate layer 26 may be made of a metal compound, and in particular, may be made of metal oxide. As a material of the gate layer 26, for example, nickel oxide, copper oxide, or molybdenum oxide is preferable. Alternatively, as the material of the gate layer 26, boron-doped p-type polysilicon, aluminum-doped p-type polycrystalline silicon carbide, or magnesium-doped p-type polycrystalline gallium nitride may be applied. The gate layer 26 is deposited using the sputtering method, the CVD method, or the like, for example.

Note that a configuration other than the above is substantially the same as the configuration of the first or second embodiment described above, and thus the same or corresponding elements are denoted by the same reference signs, and description thereof is not repeated.

According to the present embodiment, the gate layer 26 has a polycrystalline structure. This eliminates the need for advanced deposition technology to grow single crystals. Thus, the manufacturing method of the transistor 300 can be simplified.

Fourth Embodiment

Figure 22:
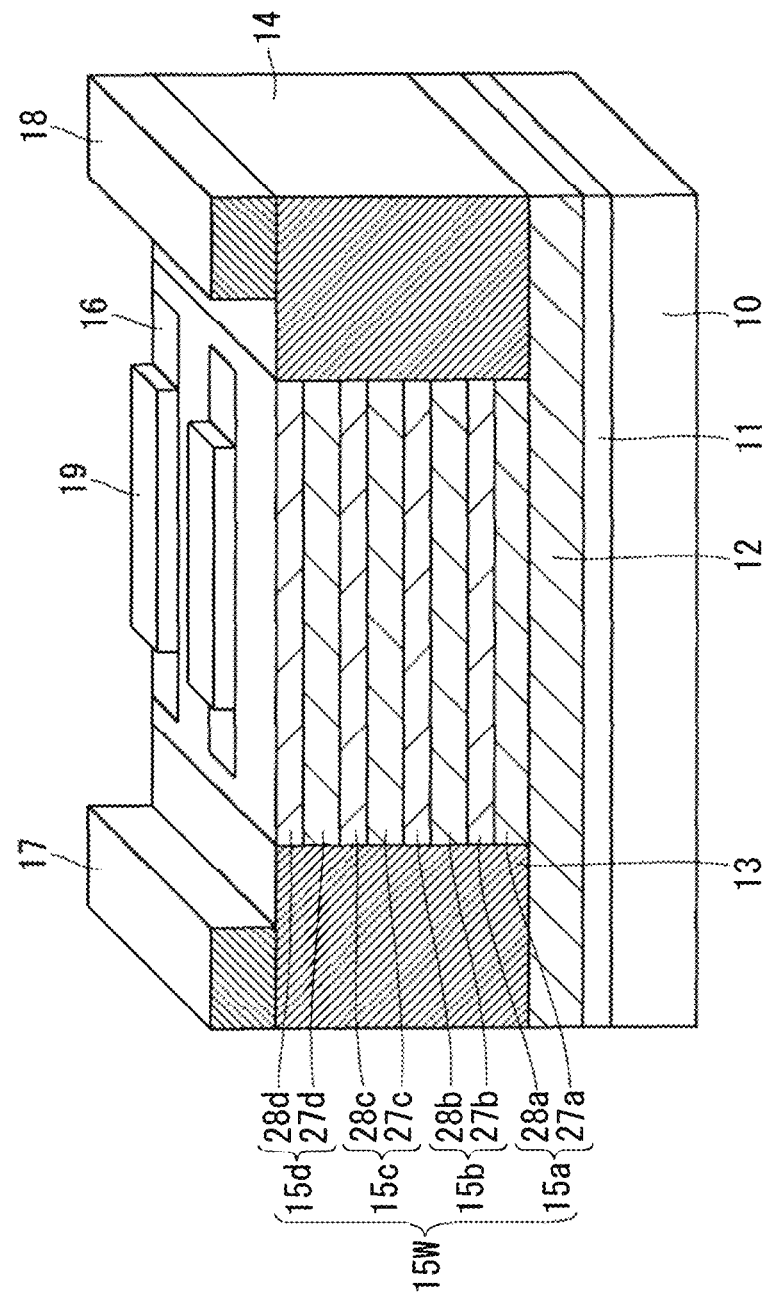
FIG. 22 is a cross-sectional perspective view schematically illustrating a configuration of a semiconductor device according to the fourth embodiment.
Figure 23:
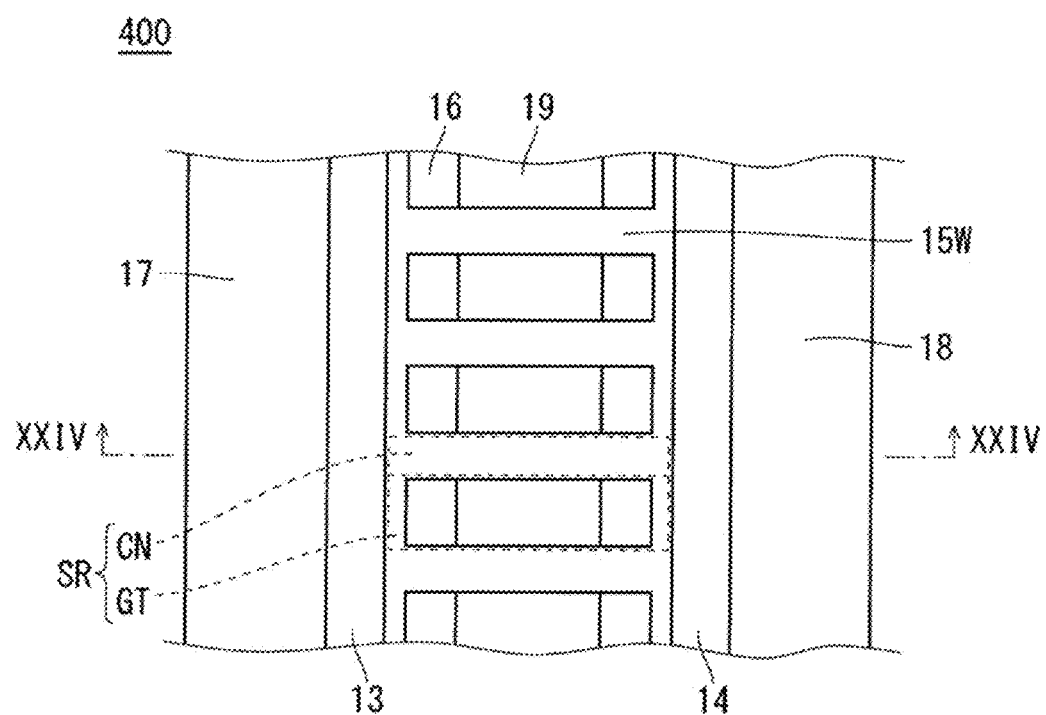
FIG. 23 is a top view of FIG. 22.
Figure 24:
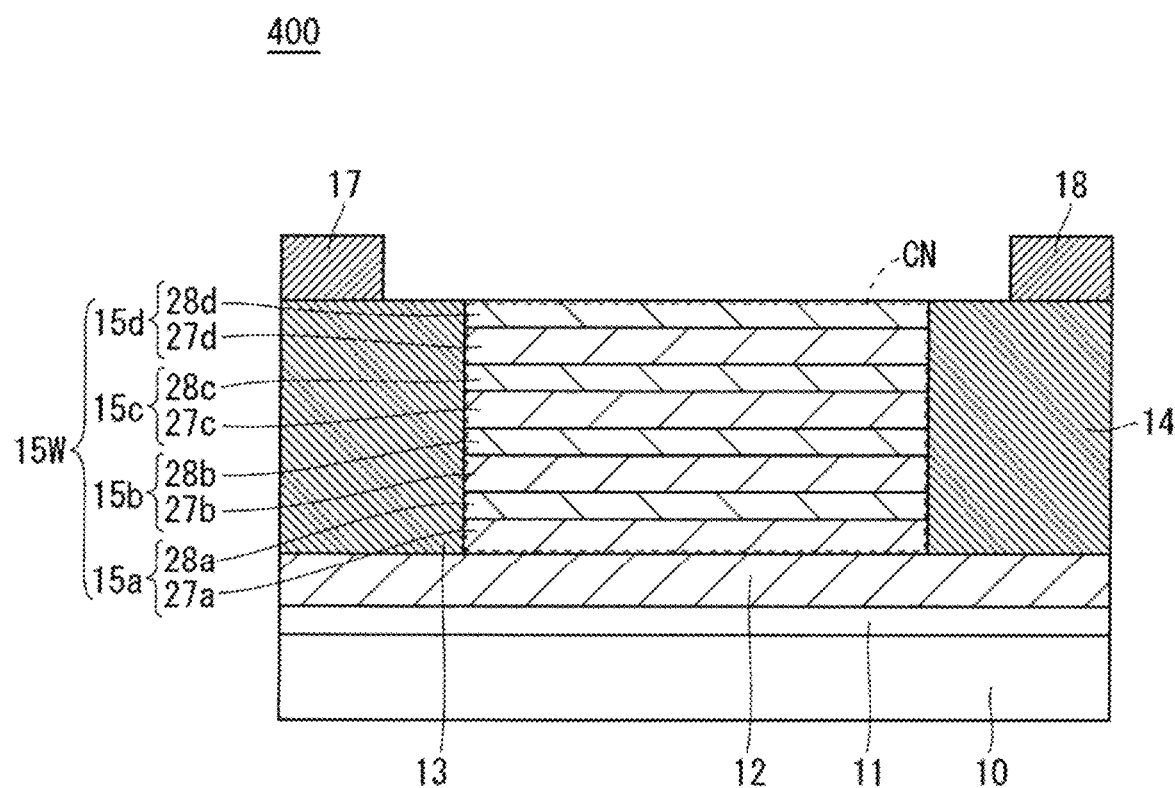
FIG. 24 is a cross-sectional view taken along the line XXIV-XXIV of FIG. 23.

FIG. 22 is a cross-sectional perspective view schematically illustrating a configuration of a transistor 400 (semiconductor device) according to the fourth embodiment. FIG. 23 is a top view of FIG. 22. FIG. 24 is a cross-sectional view taken along the line XXIV-XXIV of FIG. 23.

The transistor 400 includes a channel layer 15W instead of the channel layer 15 included in the transistor 100 (FIG. 1 to FIG. 4). The channel layer 15W is made of a nitride-based semiconductor. The channel layer 15W includes first channel films 27a to 27d (which may also be hereinafter collectively referred to as "first channel film(s) 27"), and second channel films 28a to 28d (which may also be hereinafter collectively referred to as "second channel film (s) 28"). The first channel films 27 and the second channel films 28 are alternately stacked on the p-type layer 12.

The channel layer 15W includes multiple heterojunction layers 15a to 15d. The multiple heterojunction layers 15a to 15d are formed of the multiple first channel films 27 and the multiple second channel films 28, and are stacked on each other. The heterojunction layers 15a to 15d are stacked on the p-type layer 12 in this order.

Each of the multiple heterojunction layers 15a to 15d is formed of one first channel film 27, and one second channel film 28 that is provided on the first channel film 27 and has a larger band gap than the first channel film 27. For example, the first channel film 27 is made of GaN, and the second channel film 28 is made of AlGaN. The second channel film 28 may have the n type. A dopant for providing the n type is Si, for example.

Specifically, the heterojunction layer 15a is formed of the first channel film 27a, and the second channel film 28a that is provided on the first channel film 27a and has a larger band gap than the first channel film 27a. Similarly, the heterojunction layer 15b is formed of the first channel film 27b, and the second channel film 28b that is provided on the first channel film 27b and has a larger band gap than the first channel film 27b. Similarly, the heterojunction layer 15c is formed of the first channel film 27c, and the second channel film 28c that is provided on the first channel film 27c and has a larger band gap than the first channel film 27c. Similarly, the heterojunction layer 15d is formed of the first channel film 27d, and the second channel film 28d that is provided on the first channel film 27d and has a larger band gap than the first channel film 27d.

Since the heterojunction layers 15a to 15d are multiple heterojunction layers, the heterojunction layers 15a to 15d include first and second heterojunction layers. Here, the first heterojunction layer is defined as being disposed between the second heterojunction layer and the p-type layer 12.

It is preferable that average Al composition of the second heterojunction layer in the thickness direction be lower or higher than average Al composition of the first heterojunction layer in the thickness direction. This provides a gradient in 2DEG concentration between the first heterojunction layer and the second heterojunction layer.

Note that the heterojunction layers 15a to 15d may have such composition that their average Al composition in the thickness direction reduces or increases in this order. This provides a gradient in 2DEG concentration in the entire channel layer 15W. For example, on the p-type layer 12, the channel layer 15W has a stacked structure of GaN/$Al_{0.4}Ga_{0.6}N$/GaN/$Al_{0.35}Ga_{0.65}N$/GaN/$Al_{0.3}Ga_{0.7}N$/GaN/$Al_{0.25}Ga_{0.75}N$, being stacked in this order. The composition of each layer described above is an average value of each layer in the thickness direction. In the stacked structure, the average Al composition in the thickness direction gradually reduces from 0.4 to 0.25, the farthest from the p-type layer 12 being the lowest.

It is preferable that average doping concentration of the second heterojunction layer in the thickness direction be lower or higher than average doping concentration of the first heterojunction layer in the thickness direction. This provides a gradient in 2DEG concentration between the first heterojunction layer and the second heterojunction layer.

Note that the heterojunction layers 15a to 15d may have such doping concentration that their doping concentration in the thickness direction reduces or increases in this order. This provides a gradient in 2DEG concentration in the entire channel layer 15W.

Note that a configuration other than the above is substantially the same as the configuration of the first to third embodiments described above, and thus the same or corresponding elements are denoted by the same reference signs, and description thereof is not repeated.

According to the present embodiment, not a single 2DEG layer but multiple 2DEG layers are formed in the channel layer 15W. With this, channel mobility can be further enhanced as compared to a case where only a single 2DEG layer is formed. With this, operating characteristics of the transistor 400 at microwave frequencies can be enhanced. Further, current driving capability can be enhanced.

When the 2DEG concentration has a gradient that reduces from the p-type layer 12 toward a surface side (upper side in FIG. 24), a 2DEG having relatively high concentration is distributed near the p-type layer 12. Thus, a channel owing to the 2DEG having high concentration can be more sufficiently controlled with an electric field from the p-type layer 12. Thus, high driving capability can be implemented without impairing gate controllability in the transistor 400.

When the 2DEG concentration has a gradient that increases from the p-type layer 12 toward a surface side (upper side in FIG. 24), a 2DEG having relatively low concentration is distributed near the p-type layer 12. Thus, lines of electric force from the p-type layer 12 more easily and more sufficiently reach the surface side (upper side in FIG. 24). Thus, high driving capability can be implemented without impairing gate controllability in the transistor 400.

Fifth Embodiment

Figure 26:
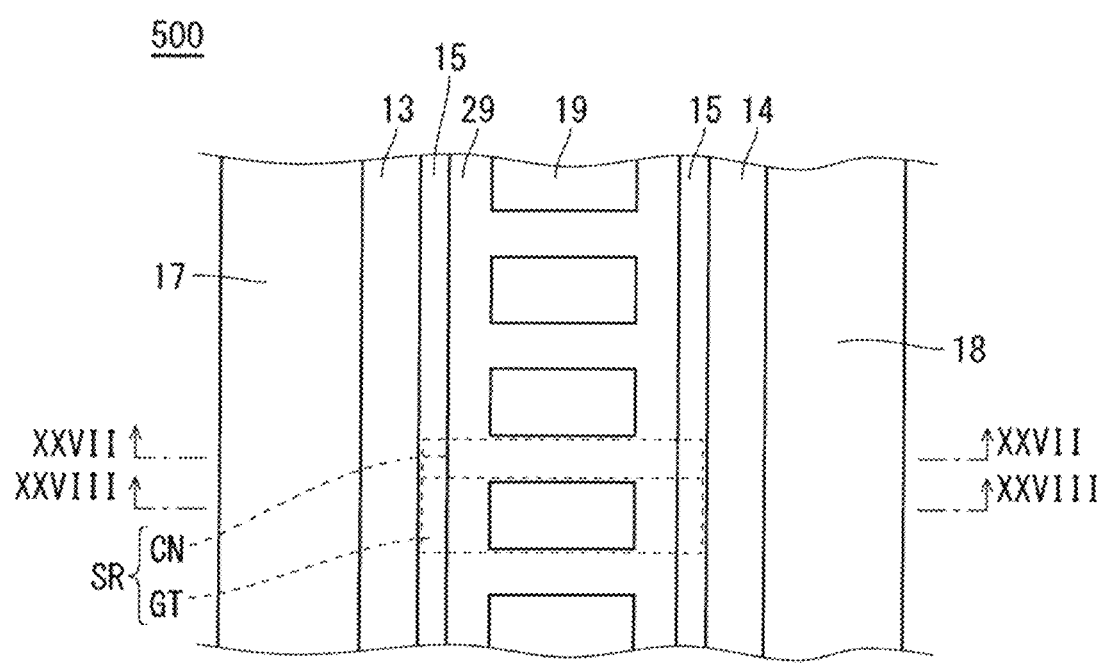
FIG. 26 is a top view of FIG. 25.
Figure 27:
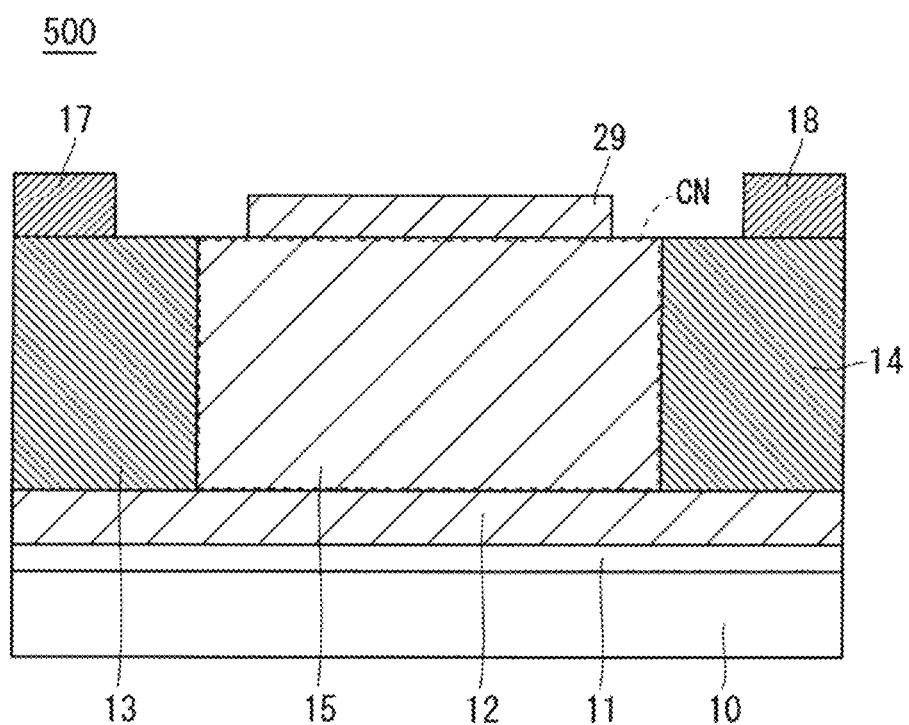
FIG. 27 is a cross-sectional view taken along the line XXVII-XXVII of FIG. 26.

FIG. 25 and FIG. 26 are a cross-sectional perspective view and a top view schematically illustrating a configuration of a transistor 500 (semiconductor device) according to the fifth embodiment, respectively. FIG. 27 and FIG. 28 are cross-sectional views taken along the line XXVII-XXVII and the line XXVIII-XXVIII of FIG. 26, respectively.

The transistor 500 further includes a p-type layer 29 (second p-type layer) made of a nitride-based semiconductor, in addition to the configuration of the transistor 100 (FIG. 1 to FIG. 4). The p-type layer 29 is of GaN or AlGaN, for example, and a dopant for providing the p type for the p-type layer 29 is Mg, for example. The p-type layer 29 is provided on the channel region CN and the gate region GT. Thus, the channel layer 15 in the channel region CN is covered by the p-type layer 29. The gate electrode 19 is disposed on the p-type layer 29 over the gate region GT, and this electrically connects the p-type layer 29 to the gate electrode 19.

Note that configuration other than the above is substantially the same as the configuration of the first to fourth embodiments described above, and thus the same or corresponding elements are denoted by the same reference signs, and description thereof is not repeated.

According to the present embodiment, the p-type layer 29 electrically connected to the gate electrode 19 is provided on the channel region CN. With this, an electric field according to a gate potential is applied to the channel layer 15 in the channel region CN from four directions. In other words, channel control of switching on and off a channel by applying a gate potential is performed through application of an electric field from four directions. This further enhances gate controllability, and thus lines of electric force from a drain to a source can be further reduced. Therefore, short-channel effects can be further suppressed.

Sixth Embodiment

Figure 29:
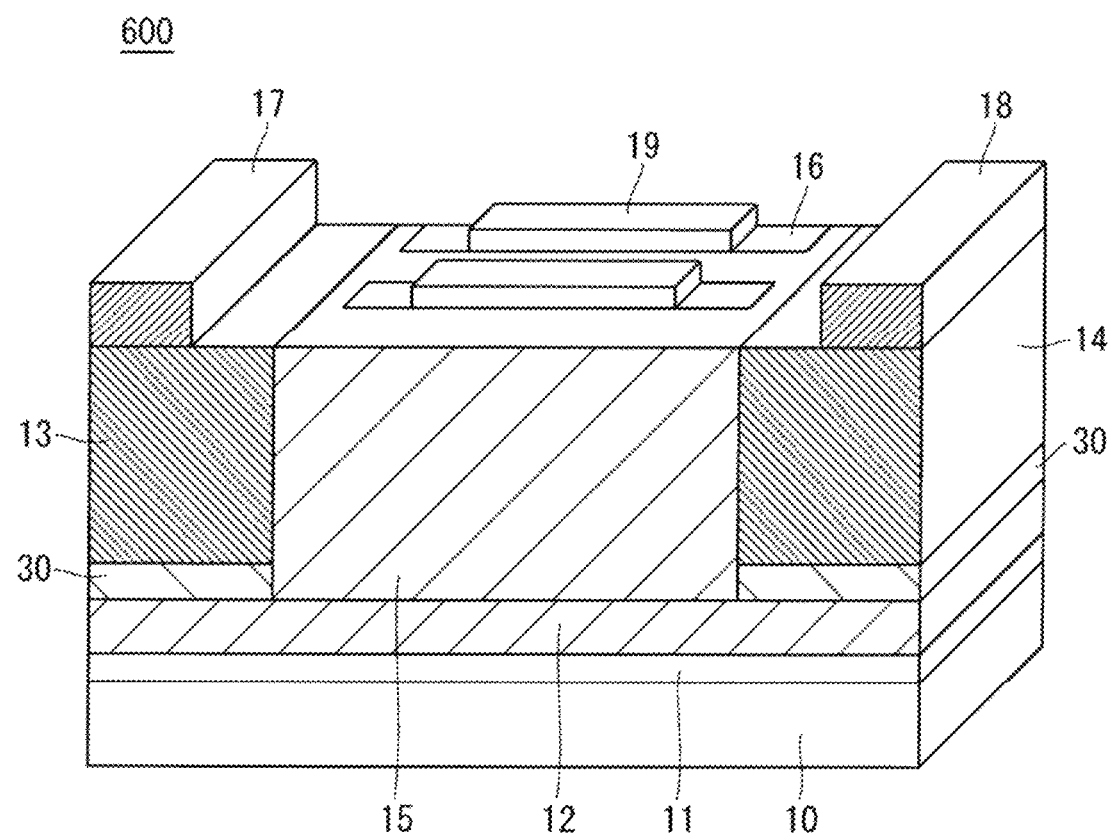
FIG. 29 is a cross-sectional perspective view schematically illustrating a configuration of a semiconductor device according to the sixth embodiment.
Figure 30:
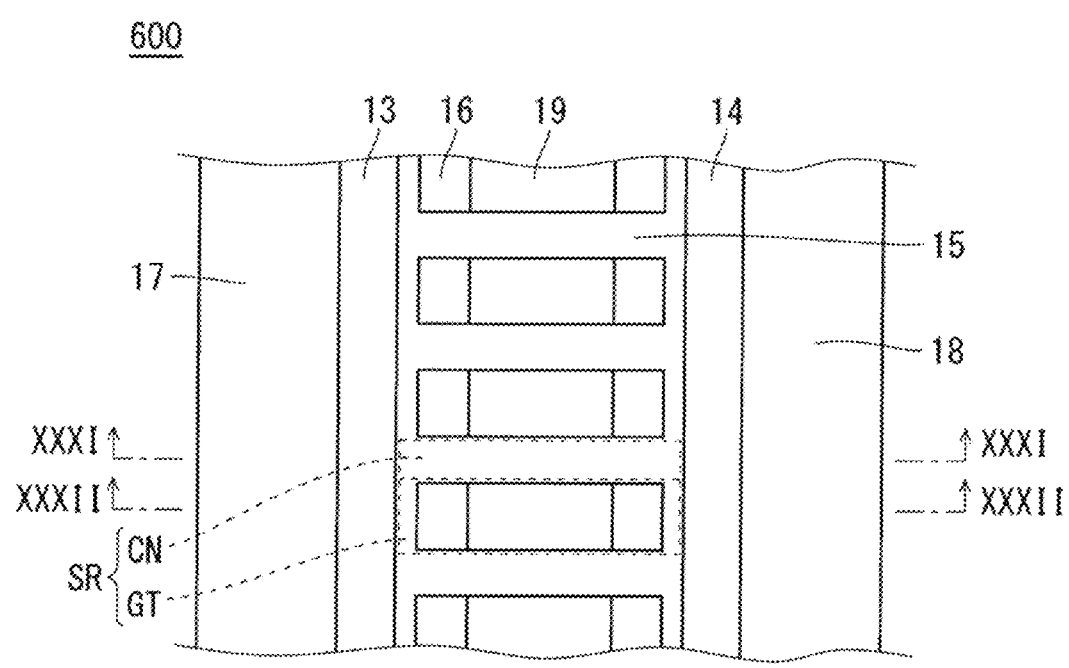
FIG. 30 is a top view of FIG. 29.
Figure 32:
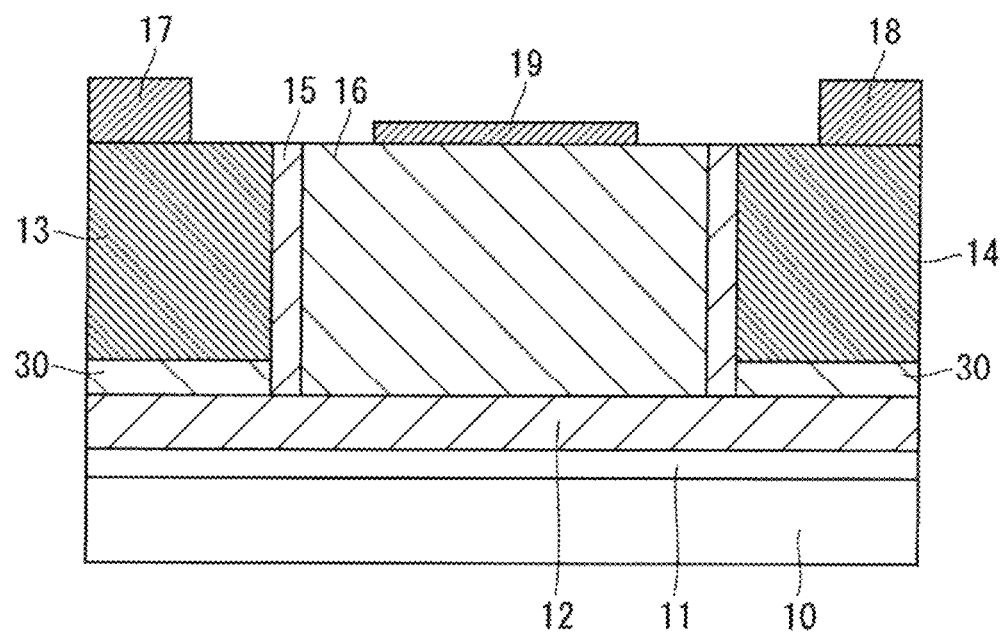
FIG. 32 is a cross-sectional view taken along the line XXXII-XXXII of FIG. 30.

FIG. 29 and FIG. 30 are a cross-sectional perspective view and a top view schematically illustrating a configuration of a transistor 600 (semiconductor device) according to the sixth embodiment, respectively. FIG. 31 and FIG. 32 are cross-sectional views taken along the line XXXI-XXXI and the line XXXII-XXXII of FIG. 30, respectively.

The transistor 600 further includes an interlayer film 30, in addition to the configuration of the transistor 100 (FIG. 1 to FIG. 4). The interlayer film 30 is provided between each of the source layer 13 and the drain layer 14 and the p-type layer 12. The interlayer film 30 is made of a nitride-based semiconductor having a larger band gap than the p-type layer 12, and is made of AlGaN, for example. The thickness of the interlayer film 30 is 15 nm or more and 100 nm or less, for example.

Note that a configuration other than the above is substantially the same as the configuration of the first to fifth embodiments described above, and thus the same or corresponding elements are denoted by the same reference signs, and description thereof is not repeated.

According to the present embodiment, when a negative voltage is applied to the gate electrode 19, an effect of cutting off reverse bias current of a pn junction between a source and a gate and between a gate and a drain is expected. In other words, an effect of reducing reverse leakage current of a pn junction is expected.

Note that each embodiment can be freely combined, and each embodiment can be modified or omitted as appropriate. While the disclosure has been shown and described in detail, the foregoing description is in all aspects illustrative and not restrictive. It is therefore understood that numerous unillustrated modifications can be devised from the present disclosure.

EXPLANATION OF REFERENCE SIGNS

CN channel region, GT gate region, SR channel structure, 10 substrate, 11 nucleation layer, 12 p-type layer (first p-type layer), 13, 13V source layer, 14, 14V drain layer, 15, 15V, 15W channel layer, 15a to 15d heterojunction layer, 16 gate layer, 17 source electrode, 18 drain electrode, 19 gate electrode, 20 first source film, 21 second source film, 22 first drain film, 23 second drain film, 24 first channel film, 25 second channel film, 26 gate layer, 27, 27a to 27d first channel film, 28, 28a to 28d second channel film, 29 p-type layer (second p-type layer), 30 interlayer film, 40, 41 mask layer, 100, 100V, 200, 300, 400, 500, 600 transistor (semiconductor device).

The invention claimed is:

1. A semiconductor device which has a first direction and a second direction perpendicular to each other in in-plane directions perpendicular to a thickness direction and can operate at microwave frequencies, the semiconductor device comprising:
    a first p-type layer being made of a nitride-based semiconductor;
    a source layer being provided on the first p-type layer and including a semiconductor region including electrons as carriers;
    a source electrode being provided on the source layer;
    a drain layer being provided to face the source layer in the first direction on the first p-type layer with a gap being provided between the drain layer and the source layer, and including a semiconductor region including electrons as carriers;
    a drain electrode being provided on the drain layer;
    a gate electrode being separated from the source electrode and the drain electrode, and being provided between the source electrode and the drain electrode in the first direction; and
    a channel structure being provided between the source layer and the drain layer on the first p-type layer, in the channel structure a channel region and a gate region being alternately disposed in the second direction, wherein
    the channel structure includes
    a channel layer forming at least a part of the channel region, and being made of a nitride-based semiconductor, the channel layer including a first heterojunction layer and a second heterojunction layer stacked on each other, and the first heterojunction layer is disposed between the second heterojunction layer and the first p-type layer, and
    a gate layer forming at least a part of the gate region, and electrically connecting the gate electrode and the first p-type layer.

2. The semiconductor device according to claim 1, wherein
    the gate layer is made of a p-type nitride-based semiconductor.

3. The semiconductor device according to claim 1, wherein
    the gate layer has a polycrystalline structure.

4. The semiconductor device according to claim 1, wherein
    the channel layer is formed of an n-type or undoped single layer.

5. The semiconductor device according to claim 1, wherein
    the channel layer is a heterojunction layer being formed of a first channel film and a second channel film being provided on the first channel film and having a larger band gap than the first channel film.

6. The semiconductor device according to claim 1, wherein
    the channel layer includes multiple heterojunction layers stacked on each other, and each of the multiple heterojunction layers is formed of a first channel film and a second channel film being provided on the first channel film and having a larger band gap than the first channel film.

7. The semiconductor device according to claim 1, wherein
    the source layer includes a first source film and a second source film being provided on the first source film and having a larger band gap than the first source film.

8. The semiconductor device according to claim 1, wherein
    the drain layer includes a first drain film and a second drain film being provided on the first drain film and having a larger band gap than the first drain film.

9. The semiconductor device according to claim 1, further comprising
    a second p-type layer being electrically connected to the gate electrode and being made of a nitride-based semiconductor, the second p-type layer being provided on the channel region.

10. The semiconductor device according to claim 1, further comprising
    an interlayer film being made of a nitride-based semiconductor having a larger band gap than the first p-type layer, the interlayer film being provided between the source layer and the first p-type layer.

11. The semiconductor device according to claim 1, further comprising
    an interlayer film being made of a nitride-based semiconductor having a larger band gap than the first p-type layer, the interlayer film being provided between the drain layer and the first p-type layer.

12. The semiconductor device according to claim 1, wherein
    the channel layer has impurity concentration equal to or lower than the impurity concentration of the gate layer.

13. The semiconductor device according to claim 1, wherein the channel layer includes multiple heterojunction layers stacked on each other, and each of the multiple heterojunction layers is formed of a first channel film and a second channel film being provided on the first channel film and having a larger band gap than the first channel film, and the multiple heterojunction layers include the first heterojunction layer and the second heterojunction layer, and average Al composition of the second heterojunction layer in the thickness direction is lower than the average Al composition of the first heterojunction layer in the thickness direction.

14. The semiconductor device according to claim 1, wherein
the channel layer includes multiple heterojunction layers stacked on each other, and each of the multiple heterojunction layers is formed of a first channel film and a second channel film being provided on the first channel film and having a larger band gap than the first channel film, and the multiple heterojunction layers include the first heterojunction layer and the second heterojunction layer, and average Al composition of the second heterojunction layer in the thickness direction is higher than the average Al composition of the first heterojunction layer in the thickness direction.

15. The semiconductor device according to claim 1, wherein
the channel layer includes a heterojunction layer formed of a first channel film and a second channel film being provided on the first channel film and having a larger band gap than the first channel film, and the second channel film has an n type.

16. The semiconductor device according to claim 1, wherein
the channel layer includes multiple heterojunction layers stacked on each other, and each of the multiple heterojunction layers is formed of a first channel film and a second channel film being provided on the first channel film and having a larger band gap than the first channel film, and the multiple heterojunction layers include the first heterojunction layer and the second heterojunction layer, and average doping concentration of the second heterojunction layer in the thickness direction is lower than the average doping concentration of the first heterojunction layer in the thickness direction.

17. The semiconductor device according to claim 1, wherein
the channel layer includes multiple heterojunction layers stacked on each other, and each of the multiple heterojunction layers is formed of a first channel film and a second channel film being provided on the first channel film and having a larger band gap than the first channel film, and the multiple heterojunction layers include the first heterojunction layer and the second heterojunction layer, and average doping concentration of the second heterojunction layer in the thickness direction is higher than the average doping concentration of the first heterojunction layer in the thickness direction.

18. The semiconductor device according to claim 1, further comprising
a substrate supporting the first p-type layer, wherein the first p-type layer is disposed between each of the source layer and the drain layer and the substrate.

19. The semiconductor device according to claim 18, further comprising
a nucleation layer between the first p-type layer and the substrate.

* * * * *